United States Patent
Naito et al.

(10) Patent No.: US 7,489,211 B2
(45) Date of Patent: Feb. 10, 2009

(54) ELECTROMECHANICAL FILTER AND ELECTRICAL CIRCUIT AND ELECTRICAL EQUIPMENT EMPLOYING ELECTROMECHANICAL FILTER

(75) Inventors: Yasuyuki Naito, Suginami-ku (JP); Yoshito Nakanishi, Machida (JP)

(73) Assignee: Panosonic Corporation, Osaka (JP)

( * ) Notice: Subject to any disclaimer, the term of this patent is extended or adjusted under 35 U.S.C. 154(b) by 237 days.

(21) Appl. No.: 10/567,645

(22) PCT Filed: Aug. 11, 2004

(86) PCT No.: PCT/JP2004/011789

§ 371 (c)(1),
(2), (4) Date: Jul. 12, 2006

(87) PCT Pub. No.: WO2005/015736

PCT Pub. Date: Feb. 17, 2005

(65) Prior Publication Data
US 2007/0188268 A1    Aug. 16, 2007

(30) Foreign Application Priority Data
Aug. 12, 2003 (JP) ............................. 2003-292669
May 11, 2004 (JP) ............................. 2004-141641
Aug. 5, 2004 (JP) ............................. 2004-229731

(51) Int. Cl.
    *H03H 9/00* (2006.01)
(52) U.S. Cl. .................... 333/186; 333/197; 310/309
(58) Field of Classification Search ................. 333/186, 333/197; 310/309
    See application file for complete search history.

(56) References Cited

U.S. PATENT DOCUMENTS

| 6,424,074 B2 * | 7/2002 | Nguyen .................... 310/309 |
| 6,737,939 B2 * | 5/2004 | Hoppe et al. ............... 333/186 |
| 6,803,840 B2 * | 10/2004 | Kowalcyk et al. .......... 333/186 |
| 6,930,569 B2 * | 8/2005 | Hsu ........................ 333/186 |
| 2002/0167374 A1 * | 11/2002 | Hunt et al. ................ 333/186 |
| 2002/0167375 A1 | 11/2002 | Hoppe et al. |

(Continued)

FOREIGN PATENT DOCUMENTS
EP    1375429    1/2004

(Continued)

OTHER PUBLICATIONS

English Language Abstract of JP 6-310976.

(Continued)

*Primary Examiner*—Vibol Tan
(74) *Attorney, Agent, or Firm*—Greenblum & Bernstein, P.L.C.

(57) ABSTRACT

An electromechanical filter capable of achieving overall miniaturization by employing a micro oscillator such as a carbon nanotube with superior conductivity so as to enable selection of signals of a predetermined frequency. The apparatus includes an inner wall composed of a carbon nanotube that changes physically as a result of an input signal, and an outer wall composed of a carbon nanotube arranged so as to cover the inner wall and spaced by a microscopic gap from the inner wall. The outer wall detects an oscillation of the inner wall when a signal of a predetermined frequency is inputted from a connected signal input side electrode to the inner wall, so that this signal is outputted via a connected signal output side electrode.

21 Claims, 20 Drawing Sheets

U.S. PATENT DOCUMENTS

2004/0065559 A1    4/2004    Iijima et al.

FOREIGN PATENT DOCUMENTS

| | | |
|---|---|---|
| EP | 1384322 | 1/2004 |
| JP | 6-310976 | 11/1994 |
| JP | 2002-255520 | 9/2002 |
| WO | 02/080360 | 10/2002 |
| WO | 02/080361 | 10/2002 |

OTHER PUBLICATIONS

"Atomic and molecular nanomechanics," Maruzen Corporation pp. 52-56, together with a partial English language translation of the same.

* cited by examiner

ELECTROMECHANICAL FILTER AND ELECTRICAL CIRCUIT AND ELECTRICAL EQUIPMENT EMPLOYING ELECTROMECHANICAL FILTER

TECHNICAL FIELD

The present invention relates to an electromechanical filter equipped with a microoscillator and an electrical circuit and electrical equipment employing this electromechanical filter.

BACKGROUND ART

As the degree of compactness of terminals such as wireless terminals advances, it is desired for passive components such as filters etc. built-into terminal casing to also be miniaturized. In recent years, in particular, in filters utilizing electrical oscillators for LC's etc. used extensively in wireless communication, oscillator size depends on electrical length. This makes it difficult to make a filter small, and a new signal selection theory is therefore sought after.

Of these, micro electromechanical filters are being made using MEMS (Micro Electro Mechanical Systems) and NEMS (Nano Electro Mechanical Systems) technology are prospective candidates for providing next-generation filters.

This electrical filter utilizes mechanical oscillations and this configuration depends on the mass and a spring constant of an oscillating oscillator. It is therefore possible to reduce size by employing an electrical oscillator. For example, the size of an oscillator oscillating at 1 GHz depends on the shape and oscillating mode but is a magnitude of less than a few microns. Further, as the size of this kind of filter is less than a few microns, a method for manufacturing a micro oscillator and a method for detecting microscopic oscillations is necessary.

As shown, for example, in Japanese Patent Laid-open Publication No. Hei. 6-310976, there exist electromechanical filters employing micro oscillators of the related art where, for example, carbon nanotubes are employed as micro oscillators. Carbon nanotubes are tube-shaped substances that are extremely small in the order of nanometers where carbon atoms are linked together to form a lattice.

A mechanism for selecting signals for an electromechanical filter in Japanese Patent Laid-open Publication No. Hei. 6-310976 assumes a case where carbon nanotubes and fullerenes are made of dielectric material. Specifically, with electromechanical filters of the related art, two each of an electrode to which an input signal port is connected and an electrode to which an output signal port is connected are provided at respective ends of a carbon nanotube of a predetermined length. These electrodes then constitute an input terminal for applying a signal to a carbon nanotube and an output terminal.

With this electromechanical filter, a carbon nanotube oscillates at its own resonance frequency due to the piezoelectric effect as a result of a signal inputted at the input signal port, and an output to the output signal port due to the piezoelectric effect may then be taken as a voltage. Further, methods such as magnetomotive and laser Doppler interference techniques are also being examined as methods for detecting oscillation of micro oscillators of the related art.

However, currently, with regards to the carbon nanotubes and fullerenes shown in Patent Document 1, there are no reports of the piezoelectric effect being seen for ferroelectric insulators, but there are reports of the possession of extremely superior conductivity. There is therefore a problem with the technology of Patent Document 1 in that implementation is difficult due to assumptions concerning the physical properties of carbon nanotubes and fullerenes.

Further, at this electromechanical filter, in a method for detecting oscillation of an oscillator constituted by a microstructure where magnetomotive techniques are employed, an apparatus for generating a large external magnetic field is necessary, and this is therefore problematic with regards to microcoil manufacturing processes and ensuring space etc. In the case of detecting oscillation of an oscillator of the related art using laser Doppler interference techniques, it is difficult to have an oscillator constituting a target at a focal point, and moreover, it is difficult to obtain sufficient reflected light. Moreover, as a further oscillation detection method, a method is being investigated where a metal or silicon (Si) mirror for reflecting laser light is provided at the tip of a miniature to defect oscillation of the structure. However, in this method, detection of oscillation of a structure including a mirror takes place and detection of oscillation characteristics of the micro oscillator itself is difficult.

DISCLOSURE OF INVENTION

It is therefore an object of the present invention to provide an electromechanical filter, an electrical circuit and electrical equipment employing this electromechanical filter and capable of achieving overall miniaturization by employing a micro oscillator such as a carbon nanotube with superior conductivity and selecting signals of a predetermined frequency.

According to an aspect of the present invention, an electromechanical filter adopts a configuration comprised of a first member changing physically as a result of input of a signal, and a second member, arranged a predetermined interval from the first member, detecting physical changes of the first member when a signal of a predetermined frequency is inputted to the first member.

BEST MODE FOR CARRYING OUT THE INVENTION

Figure 1:
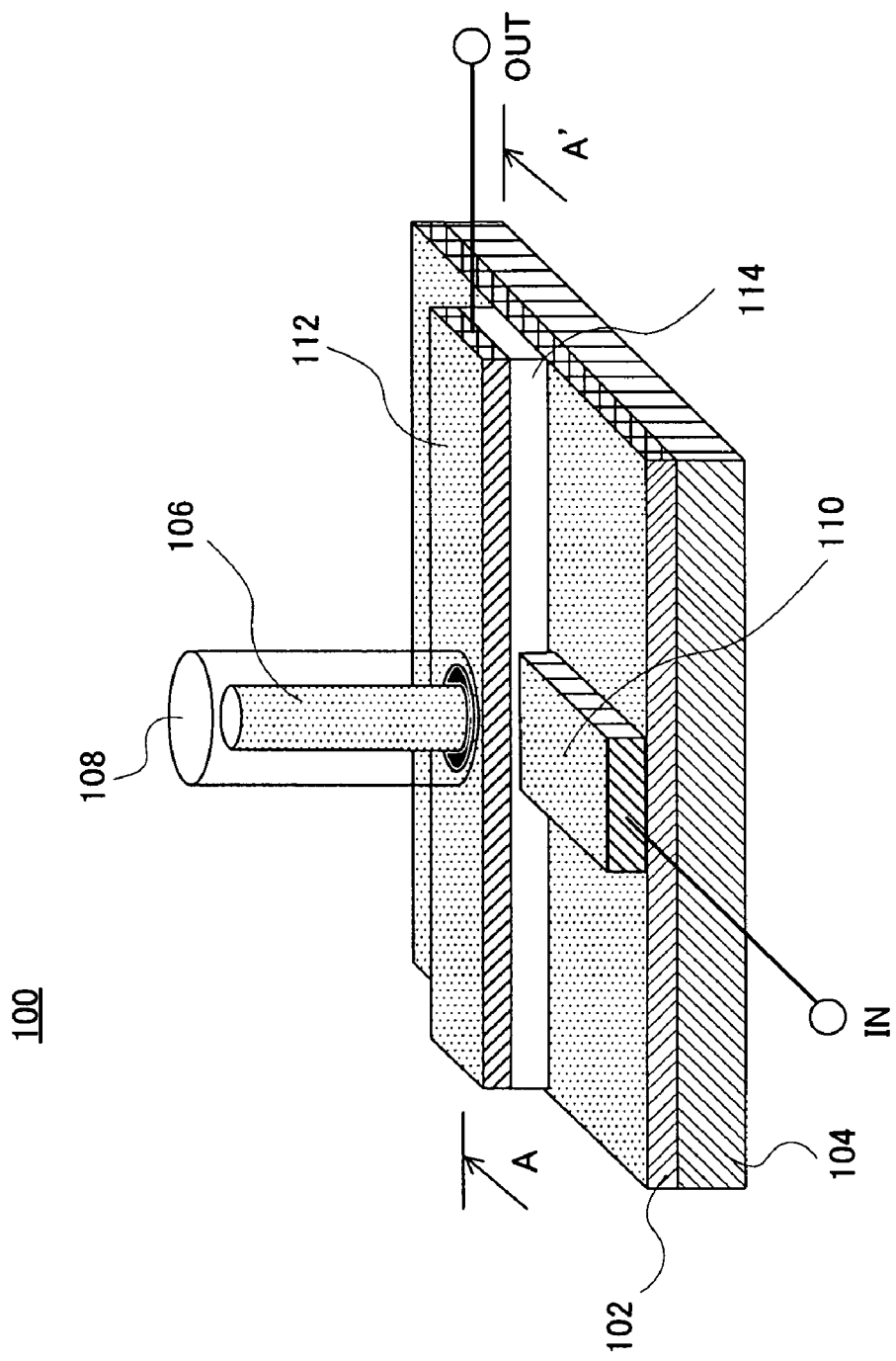
FIG. 1 is a perspective view showing a configuration for an electromechanical filter of a first embodiment of the present invention employing a multi-walled structure.

In this embodiment, a member having a structure symmetrical with respect to a central axis, i.e. a member having axial symmetry (specifically, a member having a structure symmetrical about an axis of rotation) made of a substance formed by self-assembly including carbon nanotubes, carbon nanohorn, and fullerenes that are allotropes of carbon is used as a micro mechanical oscillator (hereinafter referred to as micro oscillator) in a filter constituting a passive component of a communication terminal such as a miniaturized wireless terminal such as a mobile telephone. When a signal of the same predetermined frequency as its own resonance frequency is inputted, this signal is selectively outputted.

In particular, a microstructure formed in such a manner as to cover the micro oscillator formed by self-assembly using a wall-shaped member composed of material formed by self-assembly including carbon nanotube, carbon nanohorn, or fullerenes in the same way as for the micro mechanical oscillator may also be employed. By inputting a signal of a predetermined frequency the same as the resonance frequency to one of the micro oscillator or wall-shaped member (which here is an oscillator) of this structure, the one causes substantial excitation due to electrostatic force generated at a gap between the micro oscillator and the wall-shaped member. This in turn causes a signal of the predetermined frequency to be outputted at the other (which here is the wall-shaped member) due to change in electrostatic capacitance. For example, with an electromechanical filter of a first embodiment described below, a carbon nanotube of a diameter of several nanometers is used as the micro oscillator of the structure.

The following (equation 1) is then given taking resonance frequency of the mechanical oscillator to be f, length of the structure to be L, Young's modulus to be E, and density to be ρ.

$$f \propto \frac{1}{L^2}\sqrt{\frac{E}{\rho}} \qquad \text{(Equation 1)}$$

As is shown in (equation 1) above, it is necessary to use a material of a higher Young's modulus E and lower density ρ in order to make the resonance frequency f high. A carbon nanotube is a material of an extremely high Young's modulus in the order of 1 TPa, and is a material preferred for use as a micro oscillator generating a higher resonance frequency.

Further, a carbon nanotube is constructed by rolling a carbon sheet up into a cylinder and forming a surface member as a three-dimensional solid structure. Because of this, it is necessary to pay attention to the definition of density at the carbon nanotube but the element itself is extremely light and density of atoms forming the oscillator is low compared to other materials, making the density ρ low. If a single walled carbon nanotube is used rather than a multi-walled carbon nanotube, density is further lowered, and generation of even higher resonance frequencies is anticipated.

In the event that a nanostructure such as a carbon nanotube is used as a mechanical oscillator, in order to detect its micro-oscillations, it is necessary to form a microscopic gap smaller than an order of nanometers between the nanostructure and oscillation detection means such as an electrode etc. inputting a signal to the nanostructure. Forming of this microscopic gap is extremely difficult with artificial fine processing technology with the current capabilities of lithography technology etc. In each of the embodiments of the present invention described below, rather than using artificial means, there is provided a method for manufacturing a microstructure taken as an oscillator and oscillation detection means arranged about the periphery of the microstructure utilizing self-assembly of atoms and molecules, and there is presented a high-frequency filter employing a nanomechanism having an oscillator that self-assembles.

The following is a detailed description with reference to the drawings of preferred embodiments of the present invention.

First Embodiment

Figure 2:
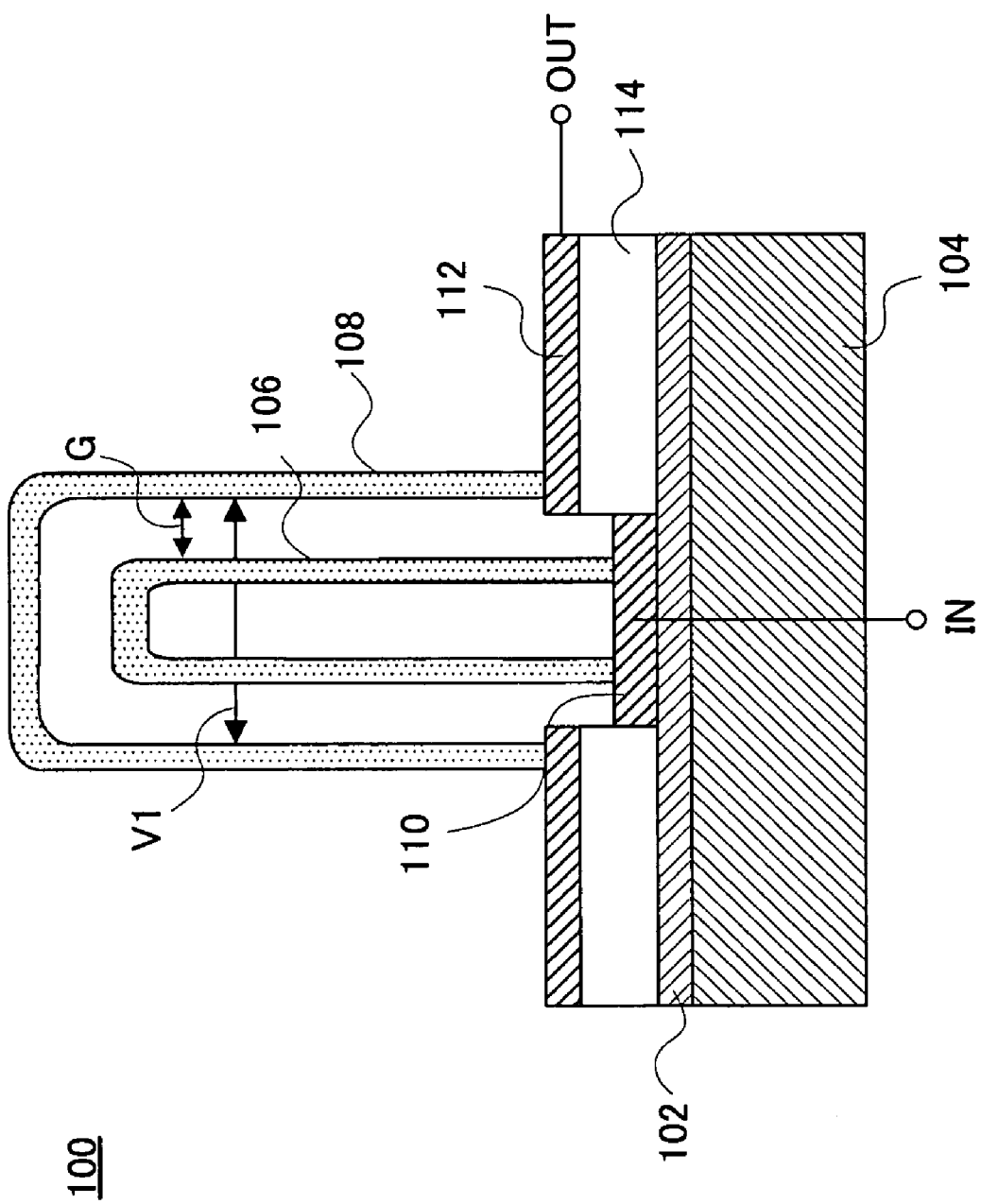
FIG. 2 is a longitudinal cross-sectional view showing a configuration for an electromechanical filter of a first embodiment of the present invention employing a multi-walled carbon nanotube.

FIG. 1 is a perspective view showing a configuration for an electromechanical filter of a first embodiment, and FIG. 2 is a cross-sectional view showing a configuration for the electromechanical filter of the first embodiment. FIG. 2 shows a cross-sectional view along A-A' of FIG. 1. Both of these drawings show a configuration for an electromechanical filter employing a carbon nanotube.

With an electromechanical filter 100 shown in FIG. 1 and FIG. 2, there is provided, on a substrate 104 with an insulating film 102 formed on its surface, an inner wall 106 constituted by a carbon nanotube formed by self-assembly and an outer wall 108 covering inner wall 106, a signal input side electrode section 110 inputting a signal to inner wall 106, a signal output side electrode section 112 outputting a signal from outer wall 108 to outside, and a spacer 114.

Substrate 104 is made of silicon etc. and insulating film 102 is made of an insulator such as oxidized silicon etc. Signal input side electrode section 110 is provided at a central section on insulating film 102 and signal output side electrode section 112 is provided at the periphery of the signal input side electrode section 110 via spacer 114.

An input signal port inputting a signal to signal input side electrode section 110 is connected to signal input side electrode section 110 and an output signal port is connected to signal output side electrode section 112. Bonding of signal output side electrode section 112 with signal input side electrode section 110 is avoided as a result of signal output side electrode section 112 being provided at insulating film 102 on substrate 104 via spacer 114.

Further, signal input side electrode section 110 and signal output side electrode section 112 are formed using a catalyst material for growth of a carbon nanotube through self-assembly such as Fe (iron), Co (cobalt), or Ni (nickel) etc.

Inner wall 106 with the base end connected is provided in a standing state on the surface of signal input side electrode section 110 and outer wall 108 with the base end connected is provided in a standing state on the upper surface of signal output side electrode section 112.

Inner wall 106 and outer wall 108 are provided with a cap section that seals the tips at the ends of the body sections of the respective cylinders arranged so that inner wall 106 is contained within outer wall 108. Inner wall 106 and outer wall 108 have a structure symmetrical with respect to a central axis. The central axis is perpendicular with respect to the substrate 104.

A predetermined interval (hereinafter referred to as "gap") G is provided between the outer surface of inner wall 106 and the inner surface of outer wall 108. Inner wall 106 is an oscillator oscillating when a signal of a predetermined frequency is inputted, and outer wall 108 is an electrode for use in detecting oscillation.

Gap G between the oscillator of inner wall 106 and the signal detection electrode of outer wall 108 is the same order of size as the gap between each wall of a multi-walled carbon nanotube and is a microscopic gap utilizing self-assembly of the carbon. The size of gap G is in the order of from several Angstroms to several tens of nm. The wall structure is such that outer wall 108 covers inner wall 106. The space occupied by inner wall 106 and outer wall 108 can therefore be made smaller by this portion where outer wall 108 covers inner wall 106 and the overall scale of the electromechanical filter can be further miniaturized.

Next, a description is given of a mechanism for signal propagation and signal selection at electromechanical filter 100.

When a signal inputted through the input signal port propagates to inner wall 106, electrostatic force is generated at the microscopic gap G due to a potential difference between inner wall 106, and outer wall 108. Inner wall 106 is then excited by this generated electrostatic force. When signals of various frequencies are inputted by the input signal port, signals of a predetermined frequency, i.e. signals of the same frequency as the resonance frequency of inner wall 106 cause substantial excitation of inner wall 106. In FIG. 2, direction of oscillation is shown by arrow V1.

In the event of substantial excitation of inner wall 106, gap G between inner wall 106 and outer wall 108 becomes narrower, resulting in an increase in electrostatic capacitance and reduction in impedance. In doing so, the signal is selectively propagated to outer wall 108 due to reduction in impedance and is propagated to the output signal port via outer wall 108 and signal output side electrode section 112. This is equivalent to microscopic oscillations of inner wall 106 being detected by the microscopic gap G formed through self-assembly of material.

On the other hand, signals of a frequency that is not resonance frequencies of inner wall 106 do not excite large amplitude fluctuations of inner wall 106 and reduction in impedance is not achieved. This means that propagation from outer wall 108 to signal output side electrode section 112 and the output signal port does not take place.

According to electromechanical filter 100, signals of a predetermined frequency can be selected and outputted and signals other than this can be blocked.

Namely, according to the first embodiment, when a signal of a predetermined frequency is inputted to inner wall 106, outer wall 108 detects physical changes of inner wall 106, i.e. detects oscillation. It is therefore possible to provide overall miniaturization by using a miniature member that changes physically as a result of inputting a signal of a predetermined frequency such as a carbon nanotube or fullerenes as inner wall 106, and signals of a predetermined frequency can be selected using outer wall 108.

Figure 3:
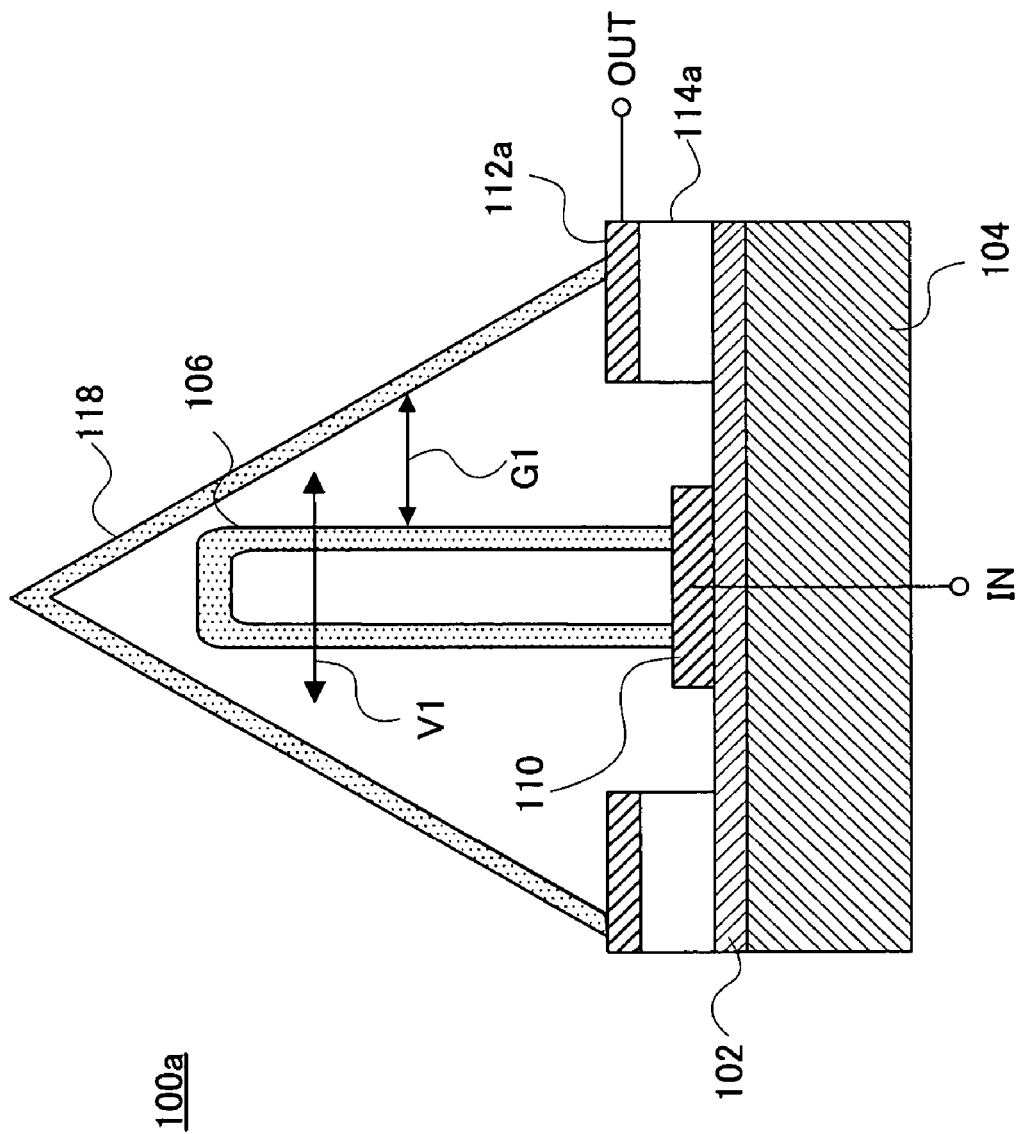
FIG. 3 is a longitudinal cross-sectional view of an electromechanical filter of the first embodiment of the present invention constituting a modified example.

FIG. 3 is a longitudinal cross-sectional view showing a modified example of the electromechanical filter of FIG. 1 and FIG. 2. With an electromechanical filter 100a shown in FIG. 3, a corniform carbon nanohorn formed through self-assembly with one end closed and spreading out towards the bottom so as to constitute a type of carbon nanotube is used as an outer wall 118 in place of outer wall 108 constituting an oscillation detection electrode of the electromechanical filter 100. With the electromechanical filter 100a of FIG. 3, aspects of the configuration that are the same as for the electromechanical filter 100 shown in FIG. 1 and FIG. 2 are given the same names and numerals and are not described. Outer wall 118 has a symmetrical structure with respect to a central axis perpendicular with respect to substrate 104.

As with the electromechanical filter 100, electromechanical filter 100a is provided with signal input side electrode section 110 to which an input signal port is connected on insulating film 102 formed at the surface of substrate 104 and signal output side electrode section 112a to which an output signal port is connected provided via a spacer 114a.

Signal input side electrode section 110 is provided with inner wall 106 connected to its surface and signal output side electrode section 112a is provided with outer wall 118 connected to its surface. Inner wall 106 is provided in a state so as to stand from signal input side electrode 112a and outer wall 118 is provided so as to cover inner wall 106 in such a manner that its axial center is coaxial with a central axis of inner wall 106. The outer wall 118 connected to signal output side electrode section 112a is a substantially conical carbon nanohorn that spreads out towards the base end and has a closed tip. Gap G between inner wall 106 and outer wall 118 therefore broadens out towards the base end of the outer wall 118.

As a result, signal output side electrode section 112a connected to the base end of outer wall 118 is constructed so as to be arranged at a position away from signal input side electrode section 110 connected to the base end of inner wall 106 on insulating film 102. The operation of patterning signal input side electrode section 110 and substrate 104 of signal output side electrode section 112a is therefore straightforward.

The signal selection mechanism at the electromechanical filter 100a is the same as for the electromechanical filter 100 and is therefore not described.

Multi or single walled carbon nanotubes can be employed as the carbon nanotubes or carbon nanohorns constituting inner wall 106, outer wall 108, and outer wall 118. Further, inner wall 106, outer wall 108 and outer wall 118 given in this embodiment are cylinder or conical with hollow insides but this is not limiting and other shapes such as rod-shapes, coniform shapes, angular columns, or angular cones are also possible.

Figure 4:
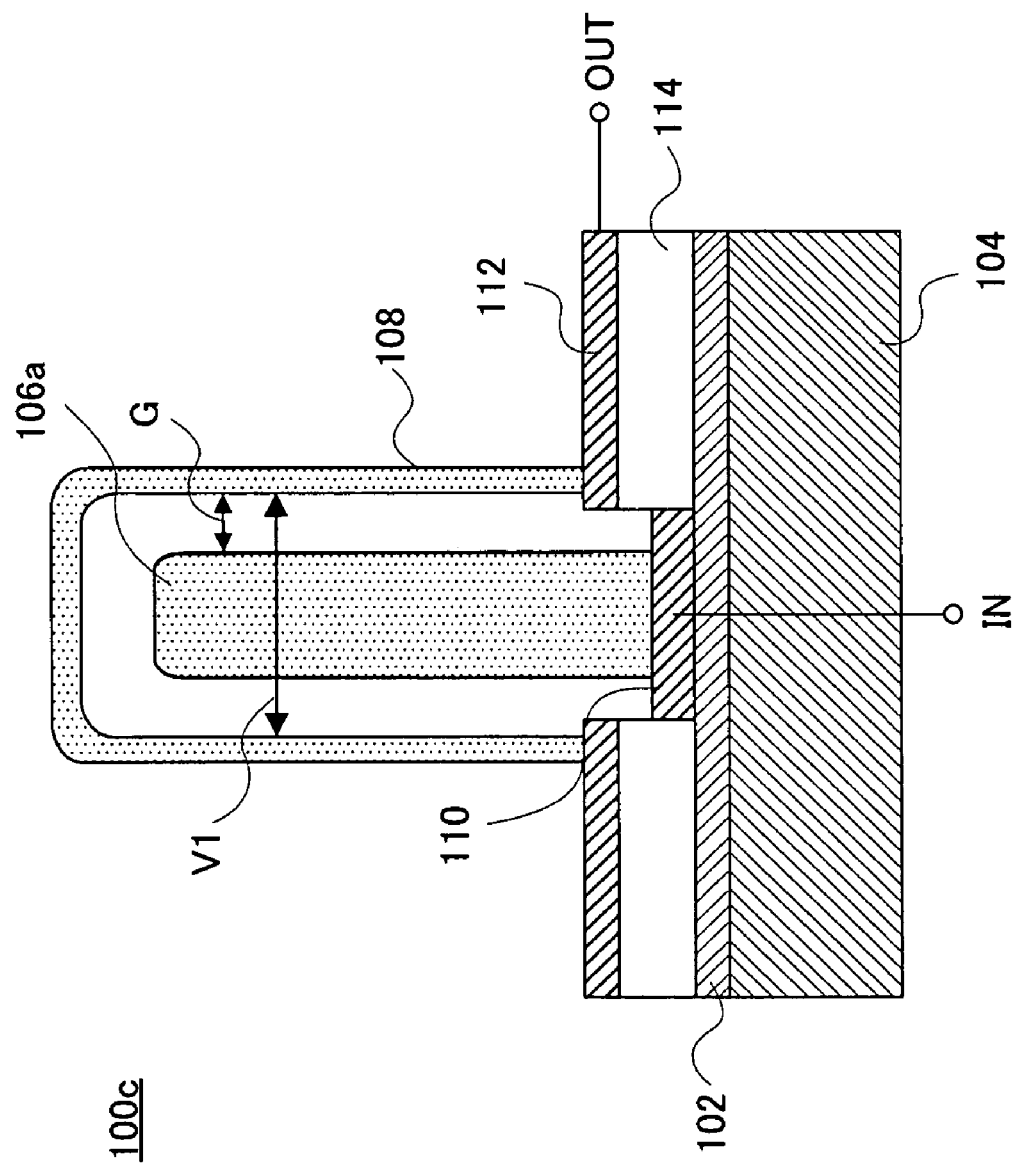
FIG. 4 is a horizontal cross-sectional view of an electromechanical filter of the first embodiment of the present invention constituting a modified example.
Figure 5:
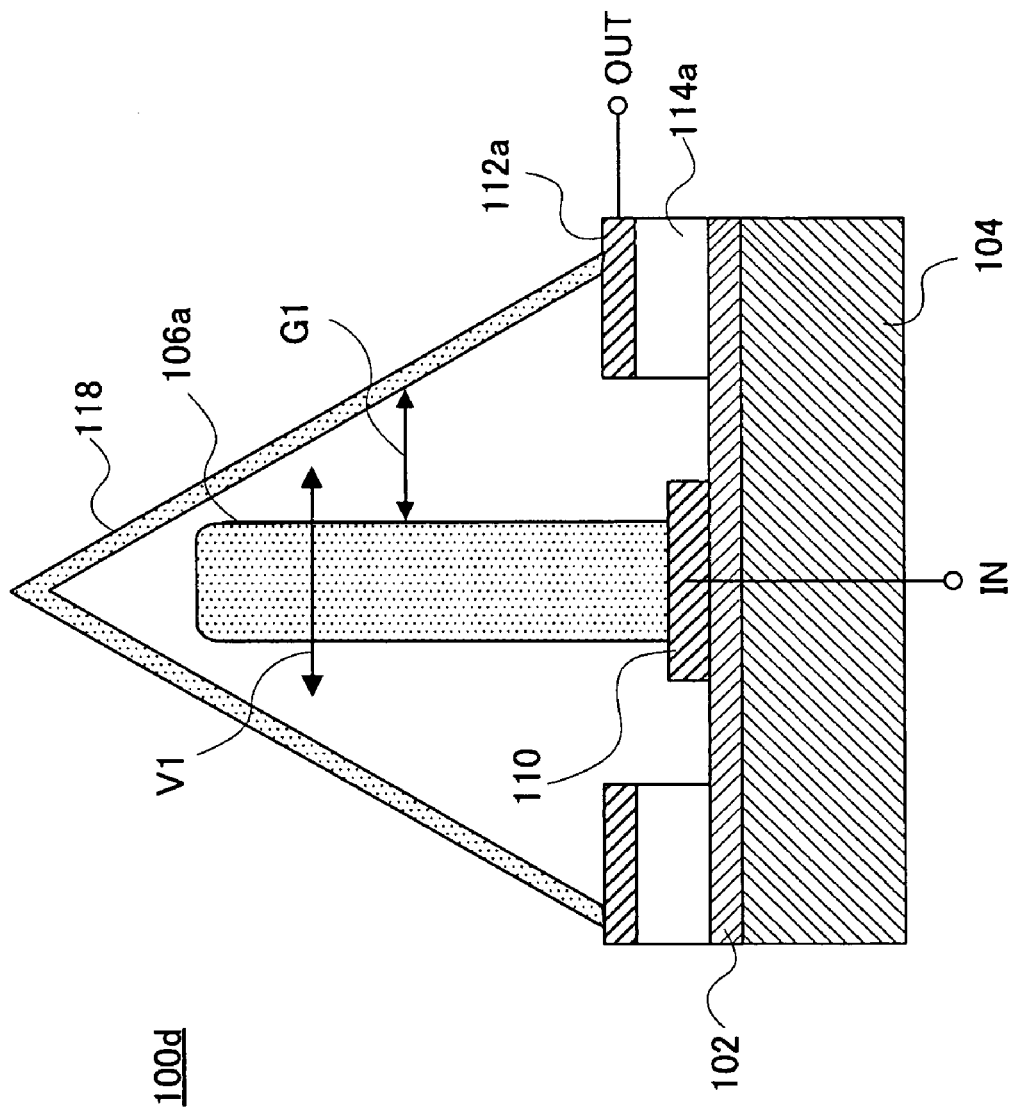
FIG. 5 is a horizontal cross-sectional view of an electromechanical filter of the first embodiment of the present invention constituting a modified example.

FIG. 4 and FIG. 5 are cross-sectional views showing modified examples of the electromechanical filter of the first embodiment. An electromechanical filter 100c shown in FIG. 4 is an example where inner wall 106 in the electromechanical filter 100 is taken to be a rod-shaped inner wall 106a. An electromechanical filter 100d shown in FIG. 5 is an example where inner wall 106 in the electromechanical filter 100a taken as the modified example in FIG. 3 is taken to be a rod-shaped inner wall 106a. Inner wall 106a has a configuration that is symmetrical with respect to the central axis. The central axis of inner wall 106a is perpendicular with respect to the substrate 104.

A description is now given of a method for manufacturing electromechanical filter 100. FIG. 6A to 6D and FIG. 7A and FIG. 7B are cross-sectional views illustrating the steps for manufacturing the electromechanical filter of the first embodiment of the present invention in stages.

Figure 6A:
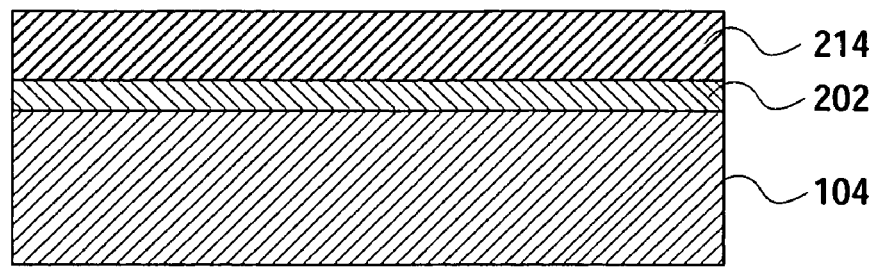
FIG. 6A is a cross-sectional view illustrating steps for manufacturing the electromechanical filter of the first embodiment of the present invention in stages.

First, as shown in FIG. 6A, oxidized silicon 202 constituting an insulating film 102 (refer to FIG. 2) is formed to a thickness in the order of 1 μm by thermal oxidation on the silicon substrate 104 and oxidized silicon 214 constituting the spacer 114 is formed to a thickness of a few tens of nm thereon through sputtering.

Figure 6B:
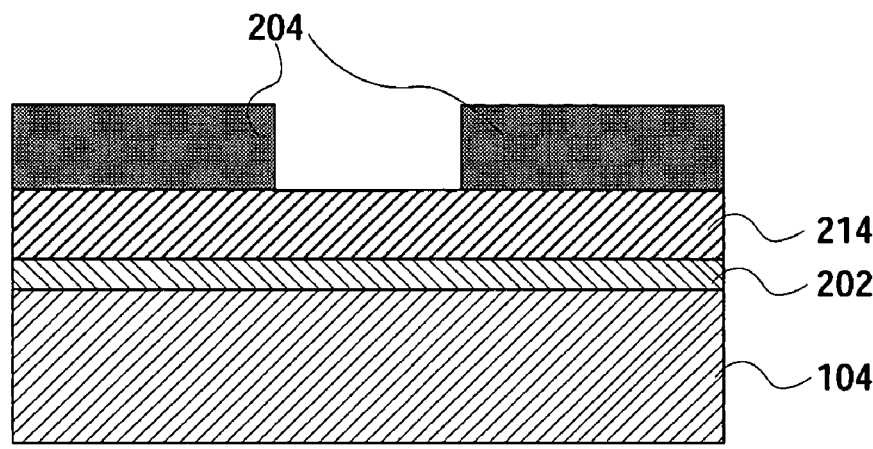
FIG. 6B is a cross-sectional view illustrating steps for manufacturing the electromechanical filter of the first embodiment of the present invention in stages.

Next, as shown in FIG. 6B, a photoresist 204 patterned using photolithography is formed in order to form the oxidized silicon 214 by dry etching.

Figure 6C:
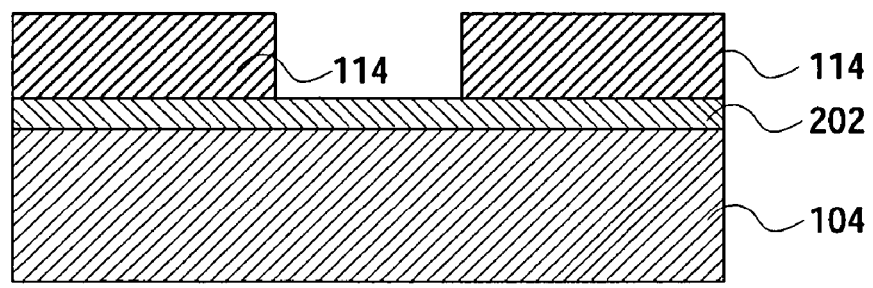
FIG. 6C is a cross-sectional view illustrating steps for manufacturing the electromechanical filter of the first embodiment of the present invention in stages.

Oxidized silicon 214 is then subjected to dry etching and photoresist 204 is eliminated by ashing. Oxidized silicon 214 on silicon substrate 104 after removal of photoresist 204 then constitutes spacer 114, as shown in FIG. 6C.

Next, each electrode section is formed (signal input side electrode section 110 and signal output side electrode section 112 as shown in FIG. 2 in this case).

Figure 6D:
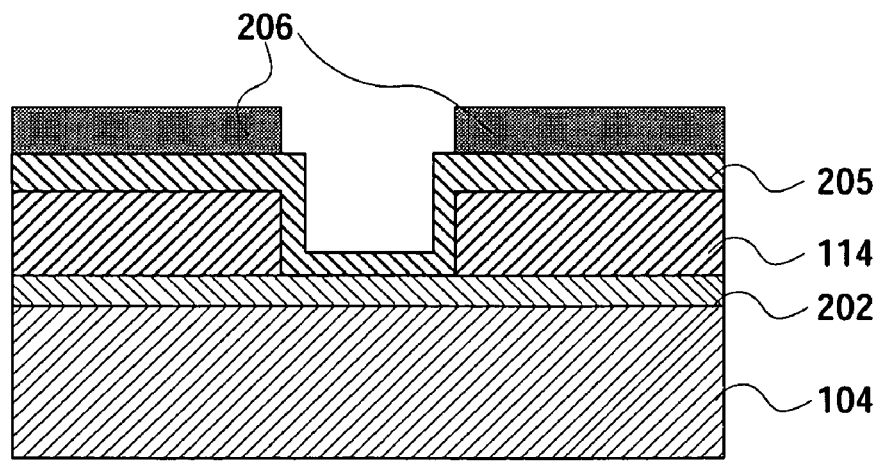
FIG. 6D is a cross-sectional view illustrating steps for manufacturing the electromechanical filter of the first embodiment of the present invention in stages.

As shown in FIG. 6D, electrode material 205 of Fe, Co and Ni etc. is deposited to the order of several tens of millimeters on an insulating film 202 between a spacer 114 and a spacer 114. A patterned photoresist 206 patterned in an electrode pattern is then formed by photolithography thereon.

Figure 7A:
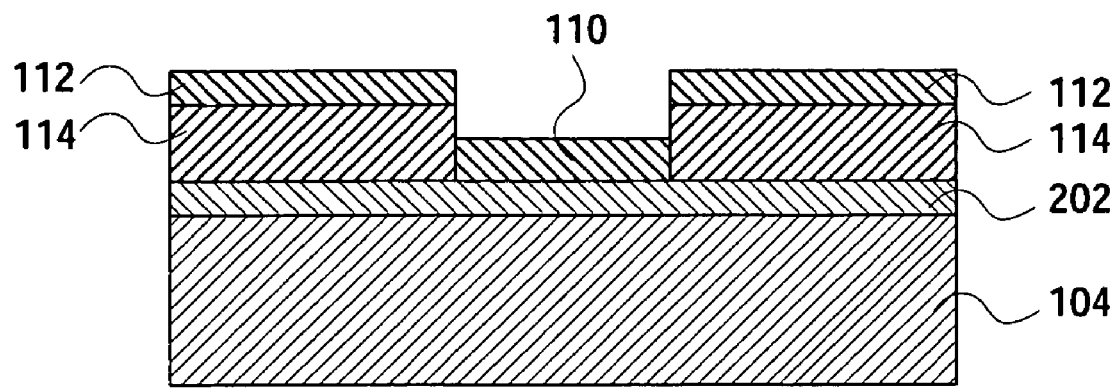
FIG. 7A is a cross-sectional view illustrating steps for manufacturing the electromechanical filter of the first embodiment of the present invention in stages.

Next, electrode material 205 is dry etched, photoresist 206 is eliminated by ashing, and, as shown in FIG. 7A, a portion of electrode material 205 on the spacer 114 is formed as an electrode section (signal input side electrode section 110, signal output side electrode section 112).

Figure 7B:
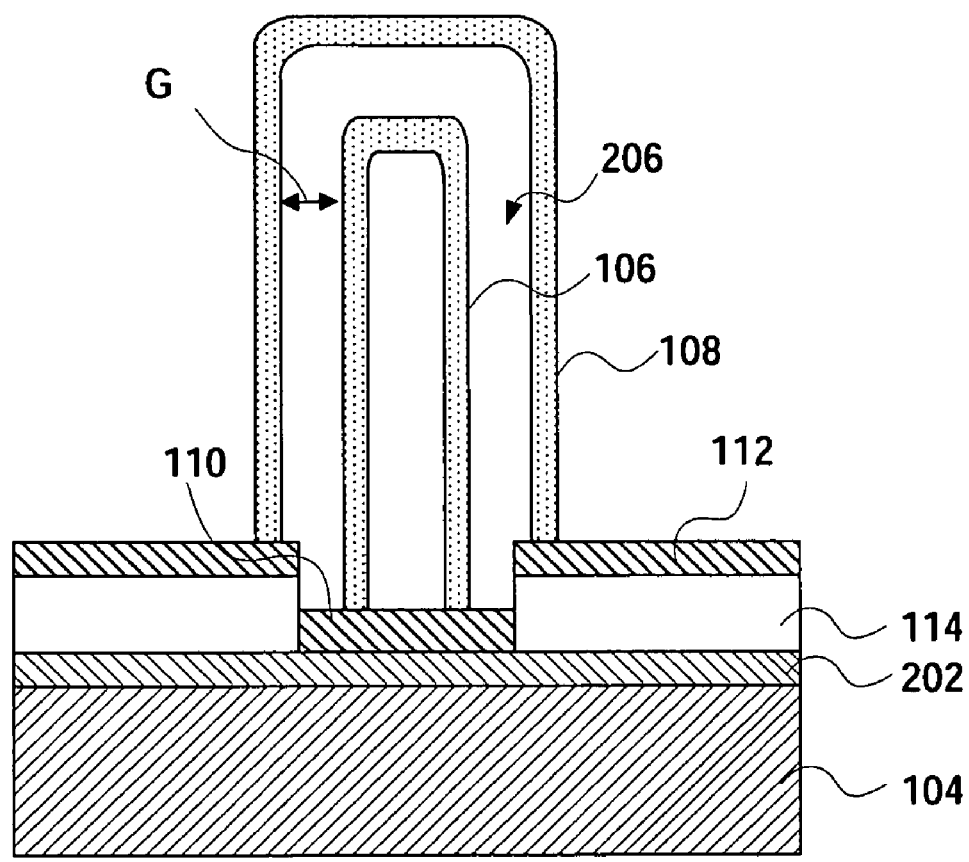
FIG. 7B is a cross-sectional view illustrating steps for manufacturing the electromechanical filter of the first embodiment of the present invention in stages.

As shown in FIG. 7A, after the electrode sections (signal input side electrode section 110, signal output side electrode section 112) are formed on the spacer 114 by processing of the electrode material 205, as shown in FIG. 7B, a carbon structure (carbon nanotubes) constituting inner wall 106 and outer wall 108 is formed using CVD (Chemical Vapor Deposition) techniques while generating an electric field in a direction orthogonal with respect to the substrate 104 on signal input side electrode section 110 and signal output side electrode section 112, so as to make a multi-walled structure 206 having inner wall 106 and outer wall 108 covering inner wall 106 using growth direction control.

As described above, it is possible to control construction of the multi-walled structure 206 formed by self-assembly using material deposition conditions (gas species, gas pressure, gas flow, RF (Radio Frequency) power, plasma state, plasma generating method, apparatus electrode shape, etc.), and electric field conditions (electric field direction, electric field strength) etc. for CVD techniques and sputtering techniques etc. It is therefore possible to control the size between inner wall 106 and outer wall 108, size of gap G, forming position, shape, and number of walls with regards to material forming a walled structure as with a carbon family material, etc.

According to this embodiment, a catalyst material for growth of carbon nanotubes such as Fe, Co, Ni etc. is taken as the electrode material for signal input side electrode section 110 and signal output side electrode section 112 respectively connected to inner wall 106 and outer wall 108 constituted of carbon nanotubes. Inner wall 106 and outer wall 108 constituted respectively of carbon nanotubes are self-assembling, and a gap G required for detecting oscillation of inner wall 106 can easily be formed to an appropriate size without artificial adjustment.

As a result, inner walls 106, 106a and 108 are microstructures, and even when a gap G between the inner walls 106, 106a and 108 is a miniature gap that is difficult to form artificially, by growing the inner walls 106, 106a and 108 through self-assembly taking signal input side electrode section 110 and signal output side electrode section 112 as a catalyst, it is possible to easily manufacture a micro electromechanical filter 100 capable of detecting signals of a predetermined frequency.

Further, the multi-walled structure constructed from the inner walls 106 and 106a and outer walls 108, 118 can also be formed through nanomanipulating or nanomanufacturing employing nanoprobes etc. In the case of a carbon family structure such as in this embodiment, control is possible by performing formation by covering inner wall 106 with an outer wall 108 or 118, pulling out a wall of the multi-walled carbon nanotube, removing a cap of a carbon nanotube, or pulling a carbon nanotube, etc.

Because the electric field for the inner walls 106, 106a and outer walls 108, 118 is asymmetrical, it is also possible to carry out steps such as pulling out, sintering, and injecting different atoms into part of outer walls 108, 118. Further, inner wall 106 and outer wall 108 at the electromechanical filter 100 employ carbon nanotubes but this is by no means limiting and may also include carbon nanohorns, fullerenes, polymers such as proteins, semiconductors such as Si, and metals such as Al etc., or other substances forming structures by self-assembly. Moreover, inner wall 106 and outer wall 108 may include substances including substances ion-doped into a carbon nanotube and other atoms and molecules, or a complex composition. Micromaterials such as carbon nanotubes may be employed as material for signal input side electrode section 110 and signal output side electrode section 112.

With electromechanical filters 100, 100a, 100c, 100d, inner walls 106, 106a are taken as oscillators, and outer walls 108, 118 are taken as electrodes for signal detection but this is by no means limiting, and it is also possible to connect an output signal port to inner wall 106 and take inner walls 106, 106b as signal detection electrodes, and to an input signal port to outer walls 108, 118 and take outer walls 108, 118 as oscillators. In this case, with the configuration for the electromechanical filter 100, 100a, it is possible for an output signal port to be connected to inner walls 106, 106a, and for an input signal port to be connected to outer walls 108, 118.

Further, according to electromechanical filters 100, 100a, 100c, 100d, it is possible to use all resonance modes including lateral oscillation, vertical oscillation, and torsional oscillation of inner wall 106 as the oscillator. Further, it is also possible to connect a plurality of the multi-walled structures composed of inner walls 106, 106a and outer walls 108, 118 of the present invention in series of in parallel to form an electromechanical filter so as to form a band pass filter, band stop filter, or filter bank etc.

Figure 8:
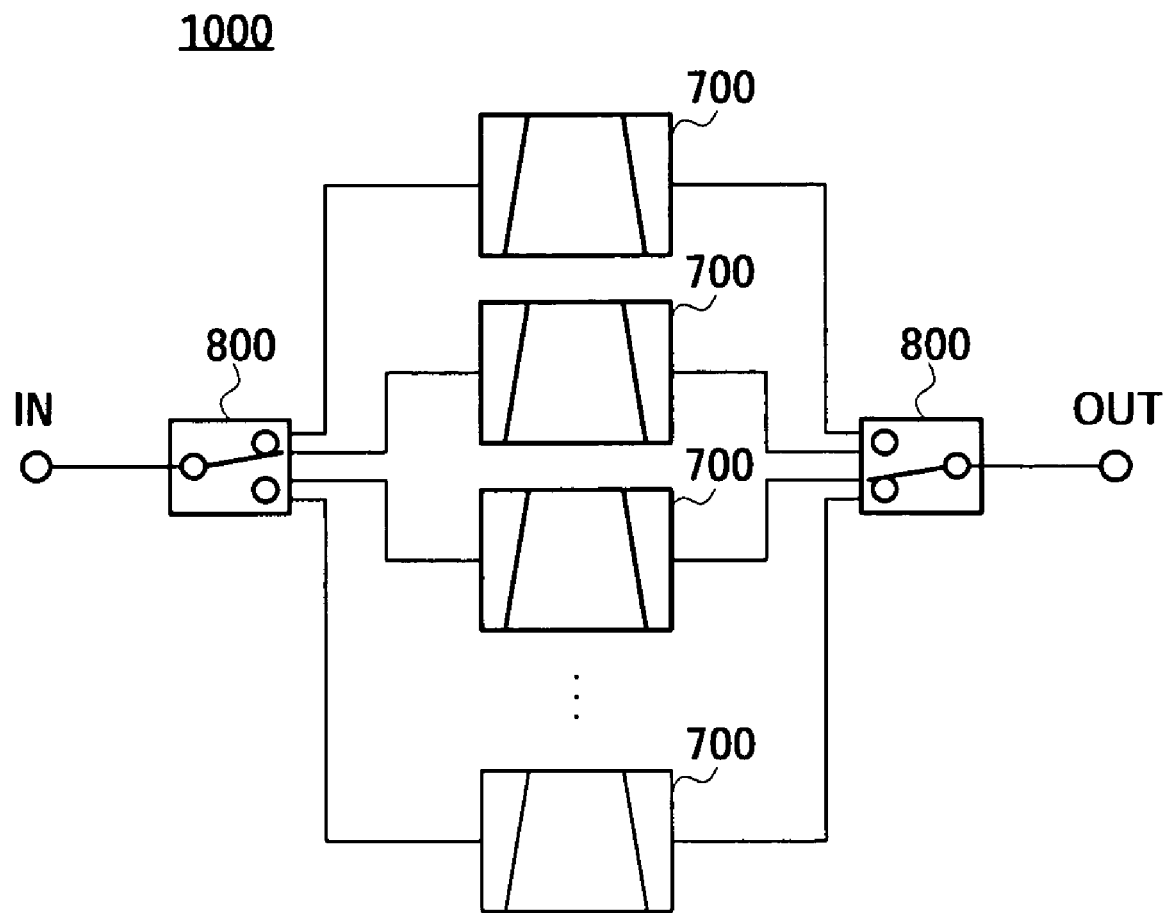
FIG. 8 is a block diagram of a filter bank circuit employing an electromechanical filter of the present invention.

FIG. 8 is a block diagram of a filter bank circuit employing an electromechanical filter of the present invention. A filter bank circuit 1000 has a plurality of electromechanical filters 700 and switches 800. The plurality of electromechanical filters 700 are the same as the electromechanical filter 100 and have different signal pass frequency bands according to each communication system. Electromechanical filters 100a, 100c or 100d may be used as the electromechanical filters 700. A plurality of either of the electromechanical filters 100, 100a, 100c or 100d may be employed as the electromechanical filters 700, or prescribed portions of these electromechanical filters 100, 100a, 100c or 100d may be divided into a predetermined number and selected as appropriate.

The filter bank circuit 1000 is constructed so as to select each of the electromechanical filters 700 using the switches 800. This kind of filter bank circuit 1000 is therefore well-suited to application in multi-band wireless equipment. It is also possible to use other CVD techniques such as plasma CVD techniques etc. Further, external electric field generating mechanisms may also be used as electric field generating methods for controlling the growth direction of the inner walls 106, 106b and outer walls 108, 118. Moreover, forming of spacers 114, 114a, signal input side electrode section 110, and signal output side electrode sections 112, 112a can be carried out using lift-off processing.

Second Embodiment

Figure 9:
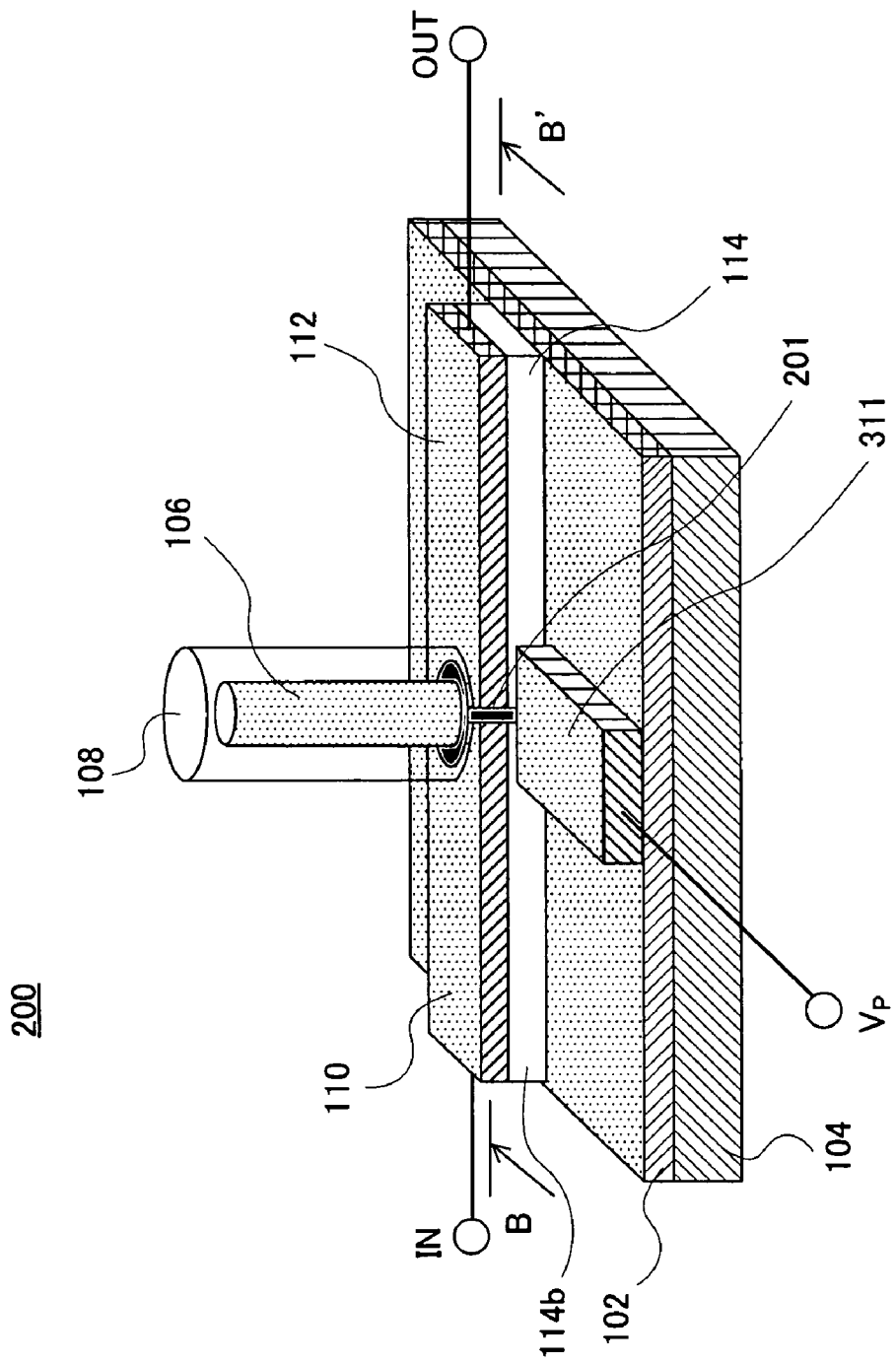
FIG. 9 is a perspective view showing a configuration for an electromechanical filter employing a multi-walled structure of a second embodiment of the present invention.
Figure 10:
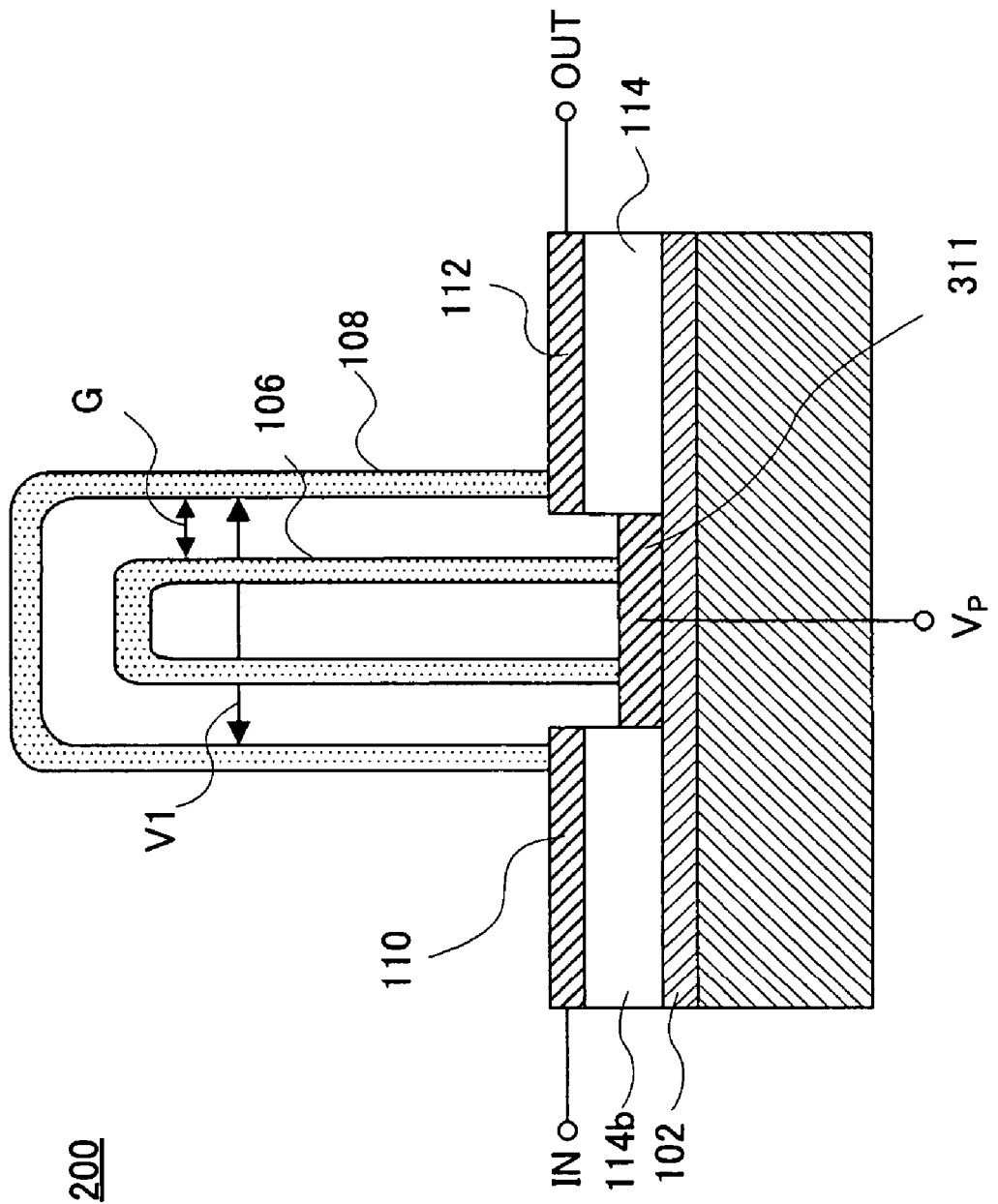
FIG. 10 is a longitudinal cross-sectional view showing a configuration for an electromechanical filter of the second embodiment of the present invention employing a multi-walled structure.

FIG. 9 is a perspective view showing a configuration for an electromechanical filter of a second embodiment of the present invention, and FIG. 10 is a cross-sectional view showing a configuration for the electromechanical filter of the second embodiment. FIG. 10 shows a cross-section along B-B of FIG. 9. The electromechanical filter shown in either of FIG. 9 and FIG. 10 exhibits a configuration employing carbon nanotubes.

Electromechanical filter 200 of the second embodiment shares basic structure and manufacturing steps with electromechanical filter 100 of the first embodiment. Therefore, in the description of electromechanical filter 200, aspects of the configuration that are the same as for the electromechanical filter 100 shown in FIG. 1 and FIG. 2 are given the same names and numerals and are not described.

Differences between electromechanical filter 200 and electromechanical filter 100 are that signal input side electrode section 110 is formed on a spacer 114b and is connected to outer wall 108, electrode section 311 is provided below inner wall 106 and voltage VP is applied to inner wall 106, and a gap 201 divides spacer 114b and spacer 114 between signal input side electrode section 110 and signal output side electrode section 112. Gap 201 can be formed by changing the mask pattern forming oxidized silicon 214 and electrode material 205 shown in FIG. 6B and FIG. 6D in the step of manufacturing the electromechanical filter 100 of the first embodiment.

Next, a description is given of a mechanism for signal propagation and signal selection at electromechanical filter 200.

When a signal inputted by the input signal port propagates to outer wall 108, electrostatic force is generated at the gap G due to a potential difference between inner wall 106 and outer wall 108. Inner wall 106 is then excited by this generated electrostatic force. When signals of various frequencies are inputted by the input signal port, signals of a predetermined frequency, i.e. signals of the same frequency as the resonance frequency of inner wall 106 composed of carbon nanotube cause substantial excitation of inner wall 106. In FIG. 10, direction of oscillation is shown by arrow V1.

In the event of substantial excitation of inner wall 106, gap G between inner wall 106 and outer wall 108 becomes narrower, resulting in and an increase in electrostatic capacitance. In doing so, a change in capacitance for the resonance frequency of inner wall 106 occurs, and voltage VP is applied to inner wall 106 by the electrode 311. This causes a signal of the resonance frequency of inner wall 106 to be excited at outer wall 108 on the side of the signal output electrode section 112.

This excited signal is propagated to the output signal port via signal output side electrode section 112. This is equivalent to microscopic oscillations of inner wall 106 being detected by the microscopic gap G formed through self-assembly of material.

On the other hand, signals of a frequency that is not the resonance frequency of inner wall 106 do not excite oscillation of maximum amplitude of inner wall 106, and a change in electrostatic capacitance cannot be obtained. Because of this, there is no propagation from outer wall 108 on the side of the signal output side electrode section 112 to signal output side electrode section 112 or the output signal port.

According to the electromechanical filter 200, signals of a predetermined frequency can be selected and outputted and signals other than this can be blocked.

Namely, according to the second embodiment, when a signal of a predetermined frequency is inputted to inner wall 106, outer wall 108 detects physical changes of inner wall 106, i.e. detects oscillation. It is therefore possible to provide overall miniaturization by using a miniature member that changes physically as a result of inputting a signal of a predetermined frequency such as a carbon nanotube or fullerenes as inner wall 106, and signals of a predetermined frequency can be selected using outer wall 108.

Outer wall 108 is electrically divided between the side of signal input electrode section 110 and the side of signal output electrode section 112. It is therefore possible to cause insulation or electrical conductivity to be deteriorated in a localized manner by pulling out, sintering, and injecting different atoms into or depositing insulating film on part of outer wall 108. An insulating body may also be formed at the gap 201.

Third Embodiment

Figure 11:
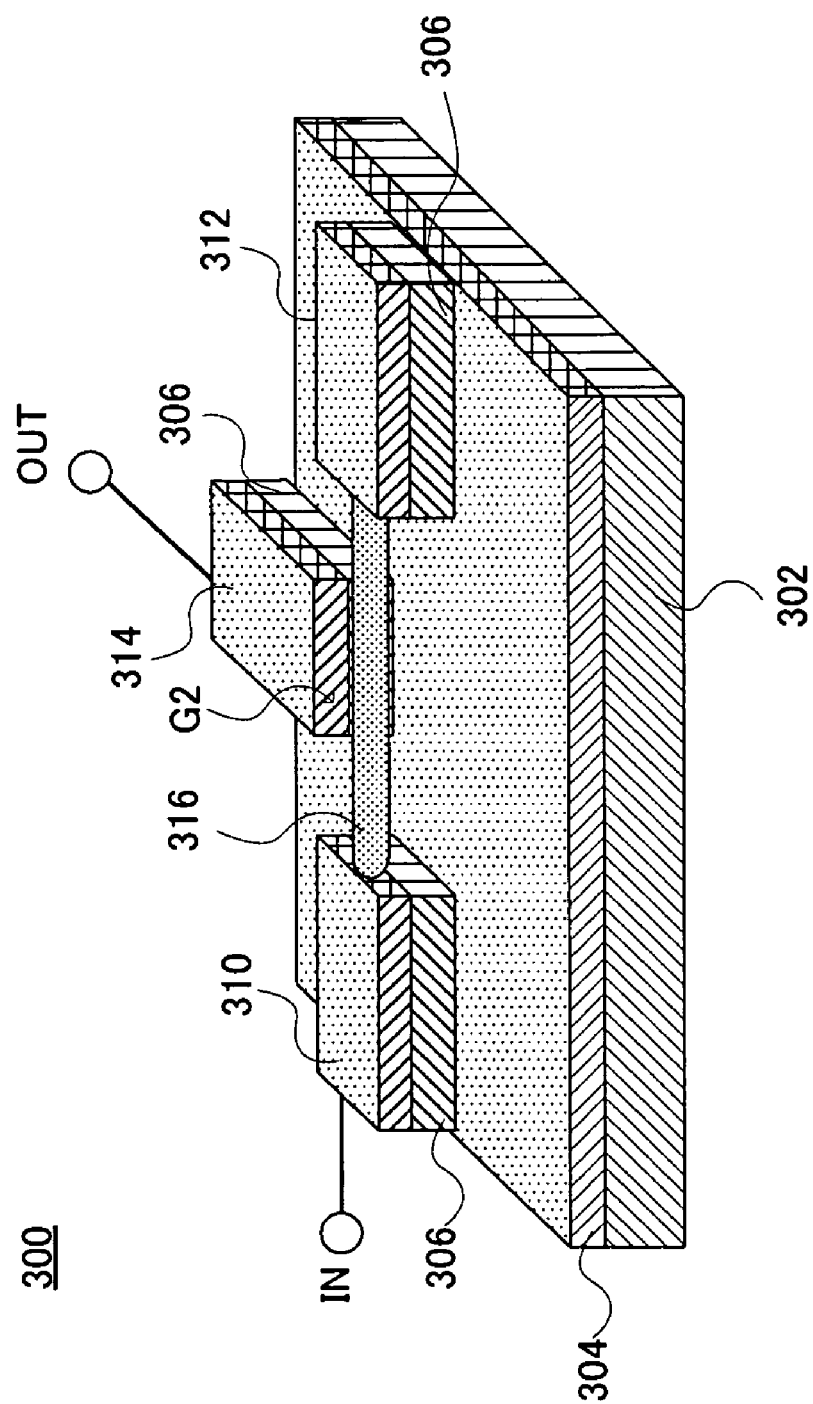
FIG. 11 is a perspective view showing a configuration for an electromechanical filter of a third embodiment of the present invention employing a multi-walled structure.

FIG. 11 is a perspective view showing a configuration for an electromechanical filter of a third embodiment of the present invention.

With an electromechanical filter 300 shown in FIG. 11, an insulating film 304 composed of oxidized silicon is formed on a silicon substrate 302, and electrode sections 310, 312, and 314 are provided spaced at predetermined intervals via a spacer 306 on this insulating film 304.

Electrode sections 310, 312, and 314 are composed of Fe (Iron), Co (cobalt), or Ni (nickel) etc. constituting a catalyst material for growth of carbon nanotubes and are arranged so as not to make contact with each other via spacer 306.

An input signal port is connected to electrode section 310 of electrode sections 310, 312, and 314. A long, cylindrical oscillator 316 is installed between this electrode section (hereinafter referred to as "signal input side electrode section") 310 and electrode section 312. Further, an electrode section (hereinafter referred to as "signal output side electrode section") 314 outputting a signal inputted via oscillator 316 as a result of oscillation of oscillator 316 is arranged at the side of the oscillator 316.

Spacer 306 is formed of oxidized silicon and electrode sections 310, 312 formed of catalyst material prevent mutual interaction of intermolecular force etc. from a foundation surface constituted by insulating film 304.

Oscillator 316 is composed of carbon nanotube, which is the same material as for inner wall 106 described above. While a signal of a predetermined frequency is inputted via electrode section 310, electrostatic force is generated with signal output side electrode section 314 so that oscillator 316 is excited by this electrostatic power. As a result of detection of this oscillation, signal output side electrode section 314 is inputted with a signal of the same frequency as the signal inputted to the oscillator 316 from the oscillator 316. Oscillator 316 has a structure symmetrical with respect to a central axis and in this case, this central axis is a horizontal axis parallel to the silicon substrate 302.

Next, a description is given of the operation of electromechanical filter 300 of the third embodiment.

A signal inputted from the input signal port propagates to oscillator 316 constituted by a carbon nanotube via signal input side electrode section 310. In this event, potential of oscillator 316 changes due to this signal, resulting in a change in electrostatic force with signal output side electrode section 314. Oscillator 316 is excited due to this change in electrostatic force and gap G2 between oscillator 316 and signal output side electrode 314 becomes narrow.

As a result of mechanical oscillation of the oscillator 316, an increase in electrostatic capacitance and reduction in impedance between oscillator 316 and signal output side electrode section 314 occurs. A signal of a frequency the same as the resonance frequency of oscillator 316 is therefore transmitted to signal output side electrode section 314 and propagates to the output signal port. Namely, a signal of a frequency outside of the pass band cannot be propagated to signal output side electrode section 314.

At electromechanical filter 300, the forming of structure such as shape etc. of a carbon nanotube constituting oscillator 316 of graphite, carbon nanotube, carbon nanohorn that is single-walled or multi-walled and is anisotropic in a growth direction is controlled using carbon nanotube forming control employing thermal CVD techniques. The structure of this carbon nanotube is formed as follows.

Next, a description is given of a method of manufacturing an electromechanical filter of the third embodiment.

FIG. 12A to FIG. 12E are cross-sectional views illustrating steps for manufacturing the electromechanical filter of the third embodiment of the present invention in stages.

Figure 12A:
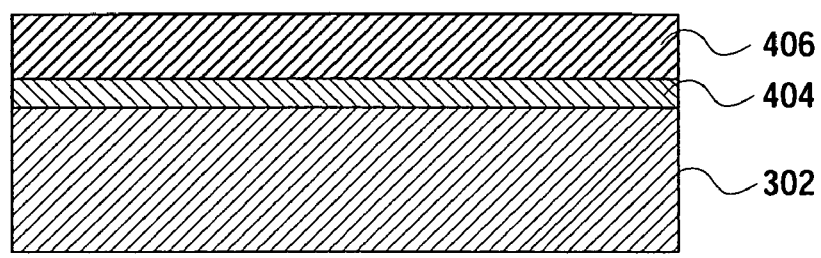
FIG. 12A is a cross-sectional view illustrating the steps for manufacturing the electromechanical filter of the third embodiment of the present invention in stages.

First, as shown in FIG. 12A, oxidized silicon 404 constituting an insulating film 304 (refer to FIG. 11) is formed to a thickness of approximately 1 μm on silicon substrate 302, and oxidized silicon 406 constituting spacer 306 (refer to FIG. 11) is formed using sputtering to a thickness of approximately 1 μm thereon.

Figure 12B:
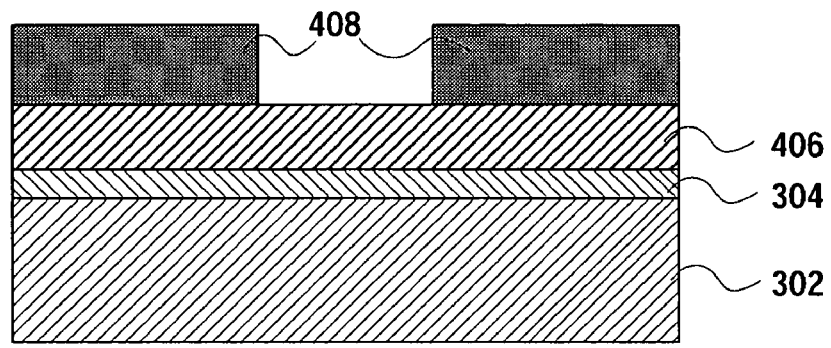
FIG. 12B is a cross-sectional view illustrating the steps for manufacturing the electromechanical filter of the third embodiment of the present invention in stages.

Next, as shown in FIG. 12B, oxidized silicon 406 formed on oxidized silicon 404 is formed by dry etching. Photoresist 408 is then formed through patterning using photolithography on the upper surface of a portion forming spacer 306 at oxidized silicon 406 in order to make this spacer 306.

In FIG. 12B, oxidized silicon 404 of FIG. 12A is formed as insulating film 304 on the surface of silicon substrate 302.

Next, oxidized silicon 406 is then subjected to dry etching and photoresist 408 is eliminated by ashing.

Figure 12C:
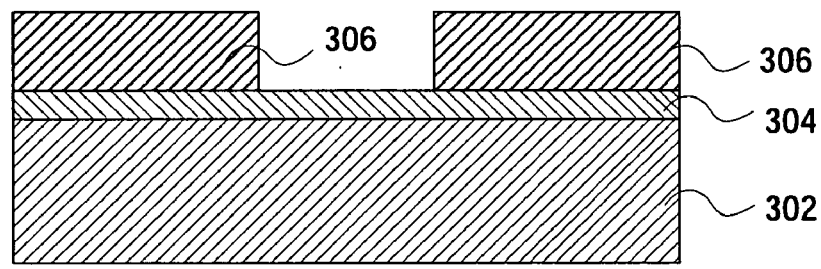
FIG. 12C is a cross-sectional view illustrating the steps for manufacturing the electromechanical filter of the third embodiment of the present invention in stages.

As a result, as shown in FIG. 12C, by removing photoresist 408 (refer to FIG. 12B) by ashing, of the oxidized silicon 406 (refer to FIG. 12B) on insulating film 304, the portion positioned below photoresist 408 is formed on insulating film 304 as spacer 306.

Figure 12D:
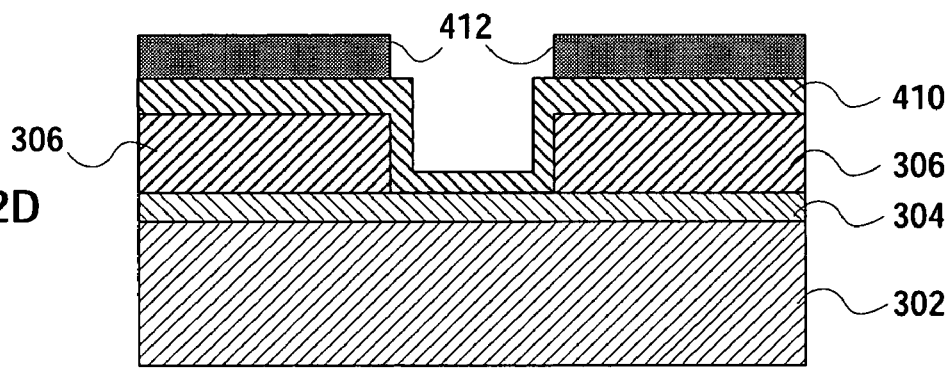
FIG. 12D is a cross-sectional view illustrating the steps for manufacturing the electromechanical filter of the third embodiment of the present invention in stages.

Next, electrode sections are formed. Namely, as shown in FIG. 12D, electrode material 410 constituting a catalyst in growth of carbon nanotubes such as Fe, Co, Ni etc. is deposited to a thickness of several tens of nm using sputtering. A photoresist 412 is then formed through patterning on the electrode pattern using photolithography on the portion of the electrode material 410 deposited on spacer 306. After dry etching of electrode material 410, photoresist 412 is removed using ashing.

As a result, portions of electrode material 410 for which photoresist 412 is deposited are formed as electrodes 310, 312, 314 (refer to FIG. 11) on spacer 306. Each of electrode sections 310, 312, and 314 is formed with predetermined intervals in-between. Signal input side electrode section 310 and electrode section 312 are arranged facing each other. Signal output side electrode section 314 is then arranged distanced by a predetermined interval (gap G2) from the center of a line linking signal input side electrode section 310 and electrode section 312 in a direction orthogonal with the line. FIG. 12D is a view showing portions of electrode material 410 constituting signal input side electrode section 310 and electrode section 312.

Figure 12E:
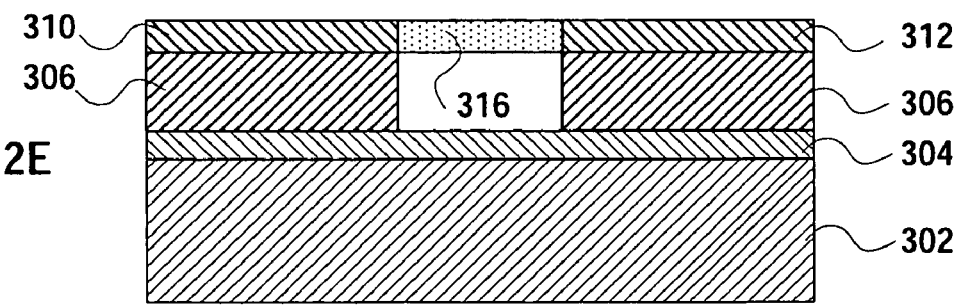
FIG. 12E is a cross-sectional view illustrating the steps for manufacturing the electromechanical filter of the third embodiment of the present invention in stages.

After forming of signal input side electrode section 310 and electrode section 312 etc. is complete, as shown in FIG. 12E, a carbon nanotube is formed using thermal CVD techniques while applying a voltage between signal input side electrode section 310 and electrode section 312 so as to grow a carbon nanotube bridging between electrode sections 310, 312 using growth direction control. A micro mechanical oscillator 316 is therefore made installed between signal input side electrode section 310 and electrode section 312. Methane gas may be used as a gas employed in thermal CVD techniques. Growth temperature of the oscillator (carbon nanotube) 316 in this case will be approximately 850 degrees centigrade.

Here, a method of controlling growth of oscillator 316 constituted by a carbon nanotube applies a voltage between signal input side electrode section 310 and electrode section 312 in order to control direction of growth of oscillator 316 to be a horizontal direction and generates an electric field in the same direction as the direction of growth of oscillator 316. Here, oscillator 316 is set to grow from signal input side electrode section 310.

As a result, the carbon nanotube is subjected to a Coulomb force of attraction in the direction of the electric field, growth commences in the direction of the electric field, and a state of bridging between signal input side electrode section 310 and electrode section 312 is attained.

Figure 13:
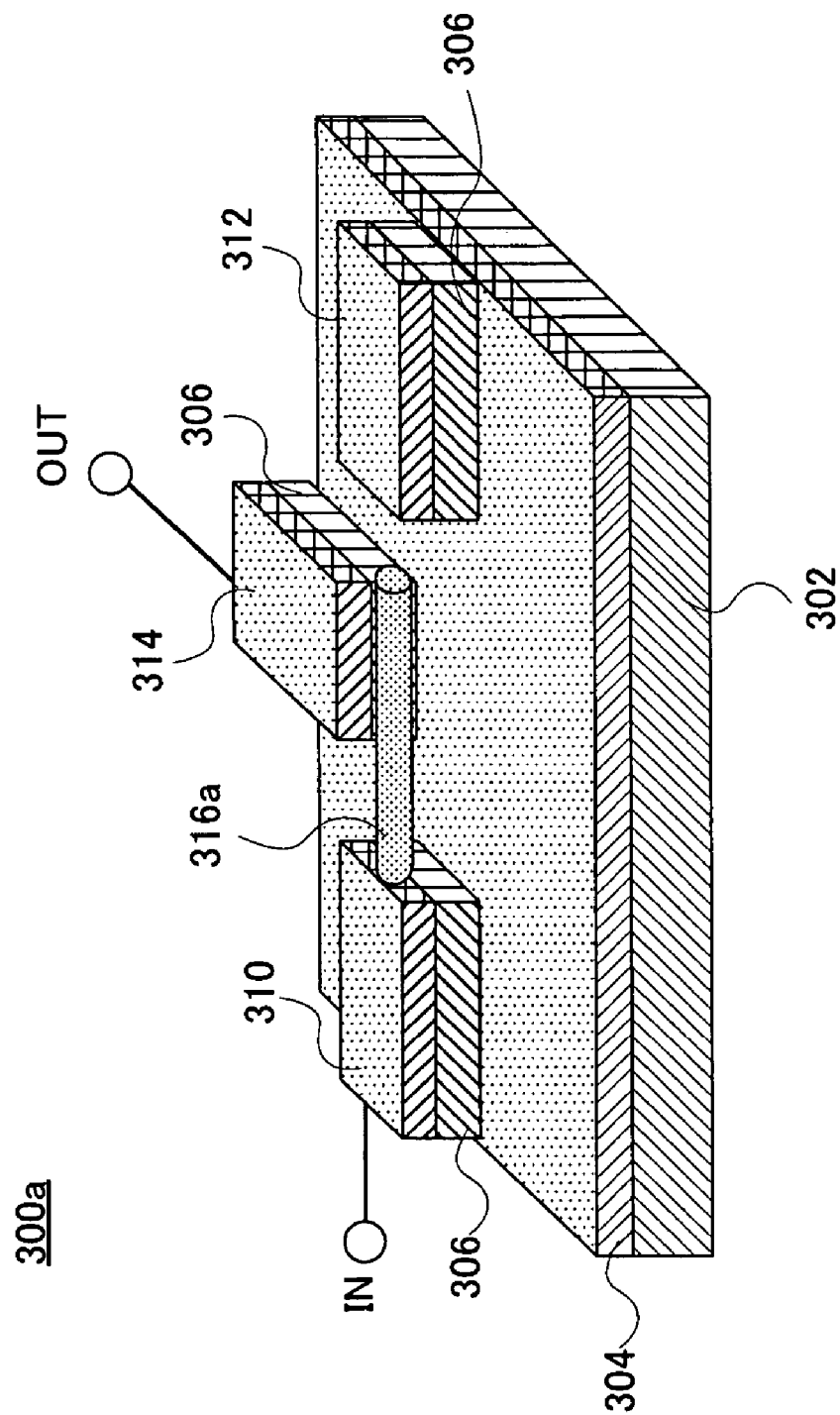
FIG. 13 is a perspective view showing a modified example of an electromechanical filter shown in FIG. 11.

If carbon nanotube growth time is controlled in this kind of step, as shown in FIG. 13, it is possible to construct a cantilever structure for the carbon nanotube constituting oscillator 316a of electromechanical filter 300a. The configuration for the oscillator of this electromechanical filter 300a different from that of the electromechanical filter 300 but other aspects of the configuration are the same. Aspects of the configuration that are the same are given the same names and numerals and are not described.

As described above, it is possible to control construction of the oscillator 316 (refer to FIG. 11) formed by self-assembly using material deposition conditions (gas species, gas pressure, gas flow, RF power, plasma state, plasma generating method, apparatus electrode shape, etc.), and electric field conditions (electric field direction, electric field strength) etc. for CVD techniques and sputtering techniques etc. It is therefore possible to control the size of oscillator 316, size of gap G2, forming position, shape, and number of walls with regards to material forming a layered structure as with a carbon family material, etc.

According to this embodiment, a catalyst material for growth of carbon nanotubes such as Fe, Co, Ni etc. is taken as the electrode material for signal input side electrode section 301 and signal output side electrode section 314 connected to oscillator 316 constituted of carbon nanotubes. Oscillator 316 constituted respectively of carbon nanotubes is self-assembling, and a gap G2 required for detecting oscillation of oscillator 316 can easily be formed to an appropriate size without artificial adjustment.

As a result, oscillator 316 is a microstructure, and even when gap G2 between oscillators 316, 316a and signal output side electrode section 314 is a miniature gap that is difficult to form artificially, by growing oscillator 316 through self-assembly taking signal input side electrode section 301 and signal output side electrode section 314 as a catalyst, it is possible to easily manufacture a micro electromechanical filter 300 capable of detecting signals of a predetermined frequency.

According to this embodiment, in the event that an input signal is inputted to oscillator 316 from an input signal port via signal input side electrode section 310, when the signal is of a frequency that is the same as the resonance frequency of the oscillator 316, oscillator 316 is excited, and an increase in electrostatic capacitance and decrease in impedance occurs with signal output side electrode section 314 so that the signal propagates to the signal output side electrode section 314, and a signal of a predetermined frequency can be selected and outputted. It is therefore possible to select and output a signal of a predetermined frequency.

It is also possible to control oscillation of the oscillator 316 by further providing control electrode sections connected to a control signal power supply at positions facing signal output side electrode section 314 and sandwiching oscillator 316.

Further, oscillator 316 at the electromechanical filter 100 employs carbon nanotubes but this is by no means limiting and may also include carbon nanohorns, fullerenes, polymers such as proteins, semiconductors such as Si, and metals such as Al etc., or other substances forming structures by self-assembly.

Moreover, oscillator 316 may include substances ion-doped into a carbon nanotube and other atoms and molecules, or a complex composition. Micromaterials such as carbon nanotubes may be employed as material for signal input side electrode section 301, signal output side electrode section 314, and electrode section 312.

Further, in FIG. 11 and FIG. 13, oscillator 316, 316a are shown as single units but configurations where pluralities are provided are also possible. Multi or single walled carbon nanotubes or multi or single walled carbon nanohorns can be employed as the carbon nanotubes constituting oscillator 316.

Further, oscillator 316 given in this embodiment is shown as a hollow cylinder but this is not limiting and other shapes such as rod-shapes, coniform shapes, angular columns, or angular cones are also possible. Further, according to electromechanical filter 300, 300a, it is possible to use all resonance modes including lateral oscillation, vertical oscillation, and torsional oscillation of oscillator 316, 316a.

Moreover, it is also possible to adopt an electromechanical filter where a plurality of electromechanical filters 300, 300a of this embodiment are connected together in series or in parallel so as to constitute a band pass filter, band stop filter, or filter bank etc.

For example, with filter bank circuit 1000 shown in the block diagram of a filter bank circuit of FIG. 8, pluralities of electromechanical filters 700 may be connected in series or in parallel with electromechanical filters 300, 300a. The results of this configuration at the filter bank circuit 1000 are the same as the case of using electromechanical filters 100, 100a, 100c, 100d as electromechanical filters 700 and are therefore not described.

Further, thermal CVD techniques are used when manufacturing oscillator 316, 316a, but this is by no means limiting, and other vapor phase epitaxy techniques such as plasma CVD techniques etc. may also be employed in manufacture. Further, external electric field generating mechanisms may also be used as electric field generating methods for controlling the growth direction of oscillator 316, 316a. Moreover, forming of spacer 306 and each of electrode sections 310, 312, and 314 may also be carried out using lift-off processing.

(Method for Detecting Oscillation of Carbon Nanotubes Constituted by Inner Wall 106, Outer Wall 108, and Oscillators 316, 316a)

Figure 14A:
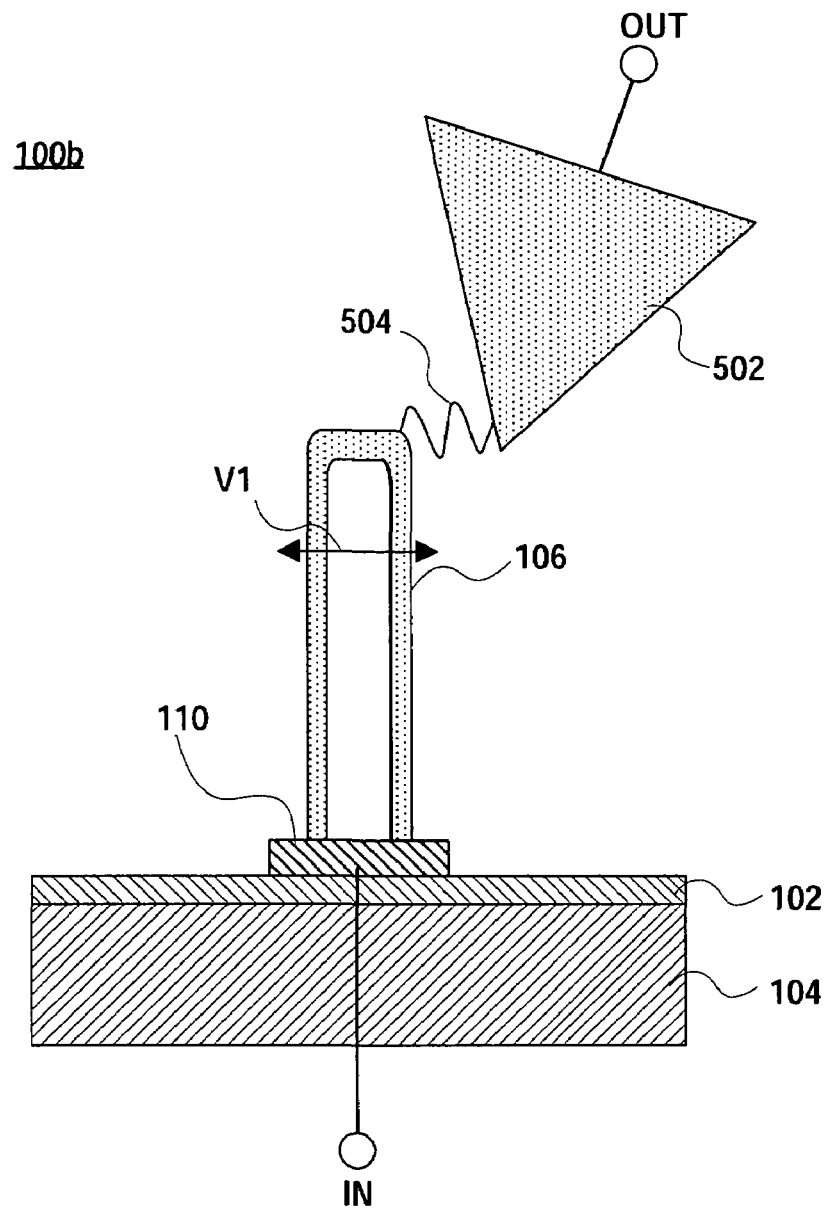
FIG. 14A is a view illustrating an example of a method for detecting oscillation of an oscillator of an electromechanical filter of the present invention.
Figure 14B:
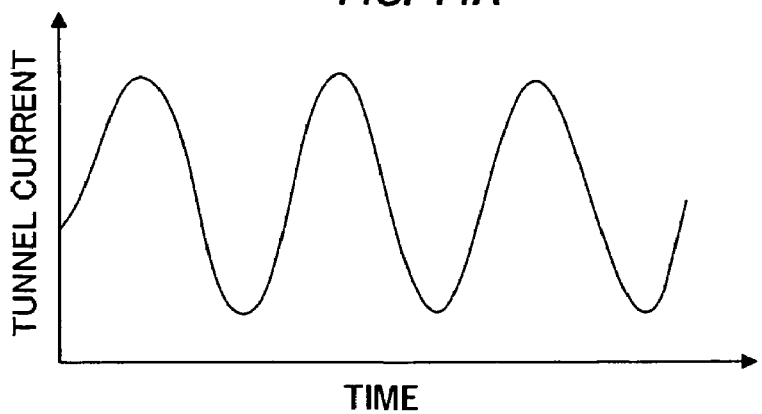
FIG. 14B is a view showing tunnel current detected from the oscillator in FIG. 14A.

FIG. 14 is a view illustrating an example of a method for detecting oscillation of an oscillator of an electromechanical filter of the present invention. FIG. 14A is a cross-sectional view illustrating detection of oscillation of carbon nanotubes used as inner walls in an electromechanical filter of the first embodiment, and FIG. 14B is a view showing detected tunnel current for FIG. 14A.

Oscillation of carbon nanotubes taken as inner walls 106 and oscillators 316 in each of the microscopic electromechanical filters 100, 100a, 300, 300a described above are oscillations of microscopic displacement. In this case, each detection of this oscillation is carried out using Scanning Tunneling Microscopy (hereinafter referred to as "STM") employing tunnel current as part of a probe.

Electromechanical filter 100b shown in FIG. 14A is electromechanical filter 100 shown in FIG. 2 with outer wall 108, spacer 114, and signal output side electrode section 112 removed. Elements of the configuration that are the same as for electromechanical filter 100 are therefore given the same numerals and are not described.

At electromechanical filter 100b, inner wall 106 is provided in a standing state at the surface of insulating film 102 formed on silicon substrate 104 as an oscillator constituted by a carbon nanotube etc. via signal input side electrode section 110.

An STM (not shown) probe tip 502 is arranged at the periphery of inner wall 106 taken as an oscillator constituted by a carbon nanotube the electromechanical filter 100b is provided with. Distance between probe tip 502 and inner wall 106 is the extent of flow of tunnel current 504 (tens of Angstroms). Change in distance between probe tip 502 and inner wall 106 while inner wall 106 oscillates (direction of oscillation shown by arrow V1) is detected as change in tunnel current 504.

As a result, as shown in FIG. 14B, oscillation of inner wall 106 is detected as oscillation of tunnel current, and frequency of oscillation of tunnel current 504 is oscillation frequency of inner wall 106 constituted by a carbon nanotube. Inner wall 106 exhibiting gigahertz band oscillation is a microstructure of an order of nanometers. Displacement of this oscillation is also microscopic and is of several tens of Angstroms. The order of this displacement is the same level of resolution of the STM detecting surface structure of an exact atomic level. Use of STM theory in the detection of microscopic oscillations is preferable because it is possible to carry out high-precision measurements.

Figure 15:
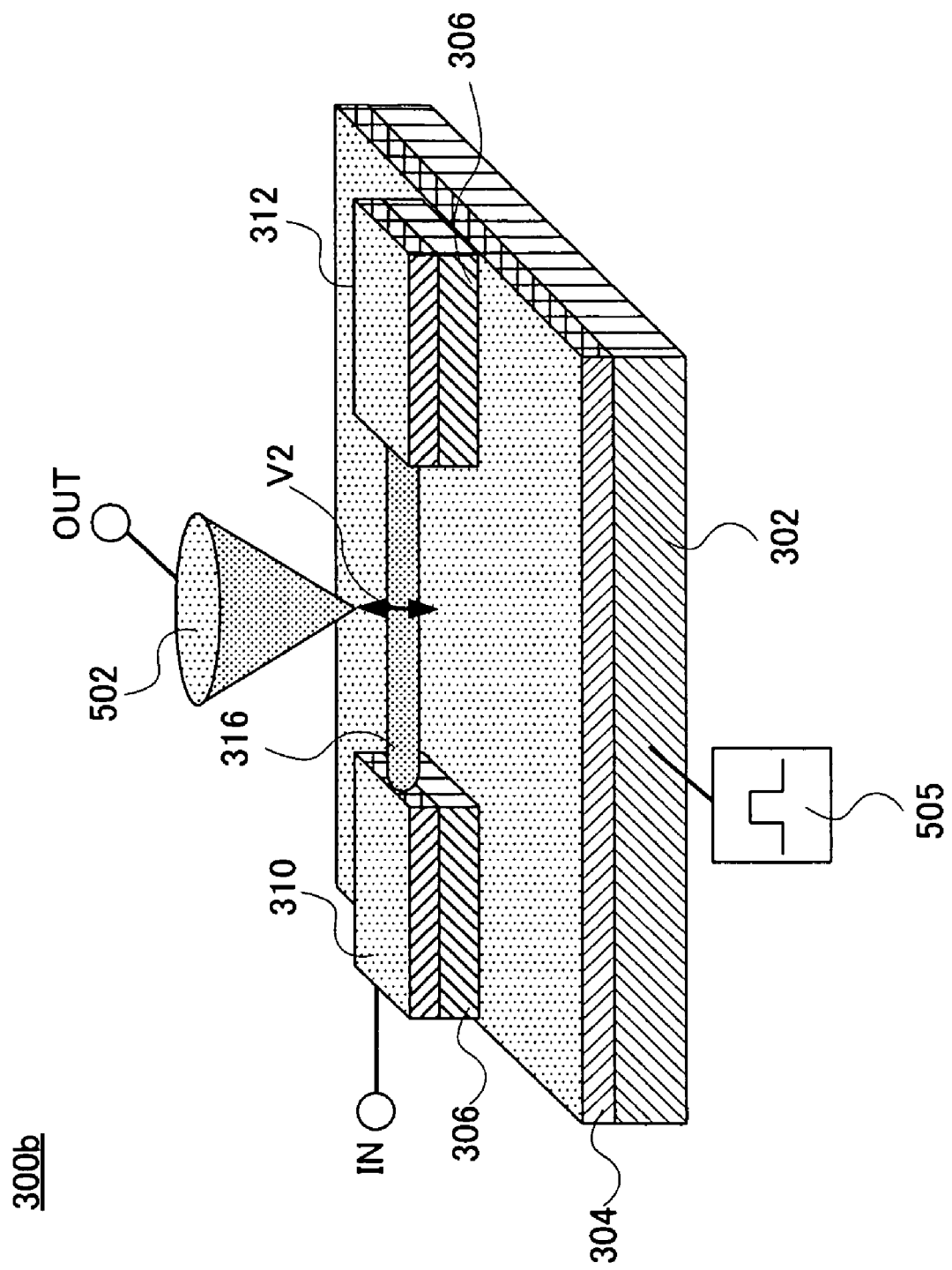
FIG. 15 is a perspective view illustrating an example application of an oscillation detection method of an electromechanical filter of a third embodiment of the present invention.

This method of detecting oscillation may also be applied to the configuration of the electromechanical filter 300 of the third embodiment. FIG. 15 is a perspective view illustrating an example of a method for detecting oscillation of an electromechanical filter of the third embodiment.

Electromechanical filter 300b shown in FIG. 15 is electromechanical filter 300 shown in FIG. 11 with signal output side electrode section 314 removed. Elements of the configuration that are the same as for electromechanical filter 300 are therefore given the same numerals and are not described.

This electromechanical filter 300b is provided with signal input side electrode section 310 and electrode section 312 spaced at a predetermined interval via spacer 306 at the surface of insulating film 304 formed on silicon substrate 302, and oscillator 316 constituted by a carbon nanotube is installed between signal input side electrode section 310 and electrode section 312.

At electromechanical filter 300b configured in this manner, probe tip 502 of the STM (not shown) is arranged above oscillator 316 while carrying out detection of oscillation of the oscillator 316. As with the time of detecting oscillation in electromechanical filter 100a, distance between probe tip 502 and oscillator 316 is the extent of flow of tunnel current (a few tens of Angstroms). Change in the distance between the probe tip 502 and the oscillator 316 during oscillation of oscillator 316 in a vertical direction (direction of oscillation shown by arrow V2) is detected as change in tunnel current. In this case, it is possible to connect a control signal power supply 505 to each of the lower electrode sections 310, 312 and silicon substrate 302 in order to generate oscillation in a vertical direction.

Positioning of the probe tip 502 of the STM may be carried out by apparatus combining an STM and a Scanning Electron Microscope (hereinafter referred to as "SEM"). It is also possible to not use an SEM if there is a fear of an electron beam of an SEM being the cause of disturbance when detecting tunnel current within an STM-SEM.

According to an oscillation detection method for inner wall 106 and oscillator 316 made of carbon nanotubes at electromechanical filters 100b, 300b, when probe tip 502 of an STM is employed, and change in tunnel current between inner wall 106 and oscillator 316 and probe tip 502 is detected, it is possible to detect microscopic oscillations in a straight forward manner. This differs from magnetomotive techniques, laser Doppler interference techniques, and methods of detection using metals or silicon (Si) mirrors etc. for reflecting lasers in that large apparatus for generating external magnetic fields for detection and substantial amounts of space for detection operations are not necessary, there is no detection of oscillation including a mirror as in the case of employing a mirror, and it is possible to detect oscillation characteristics of a microscopic inner wall 106 and oscillator 316 themselves.

Fourth Embodiment

Figure 16:
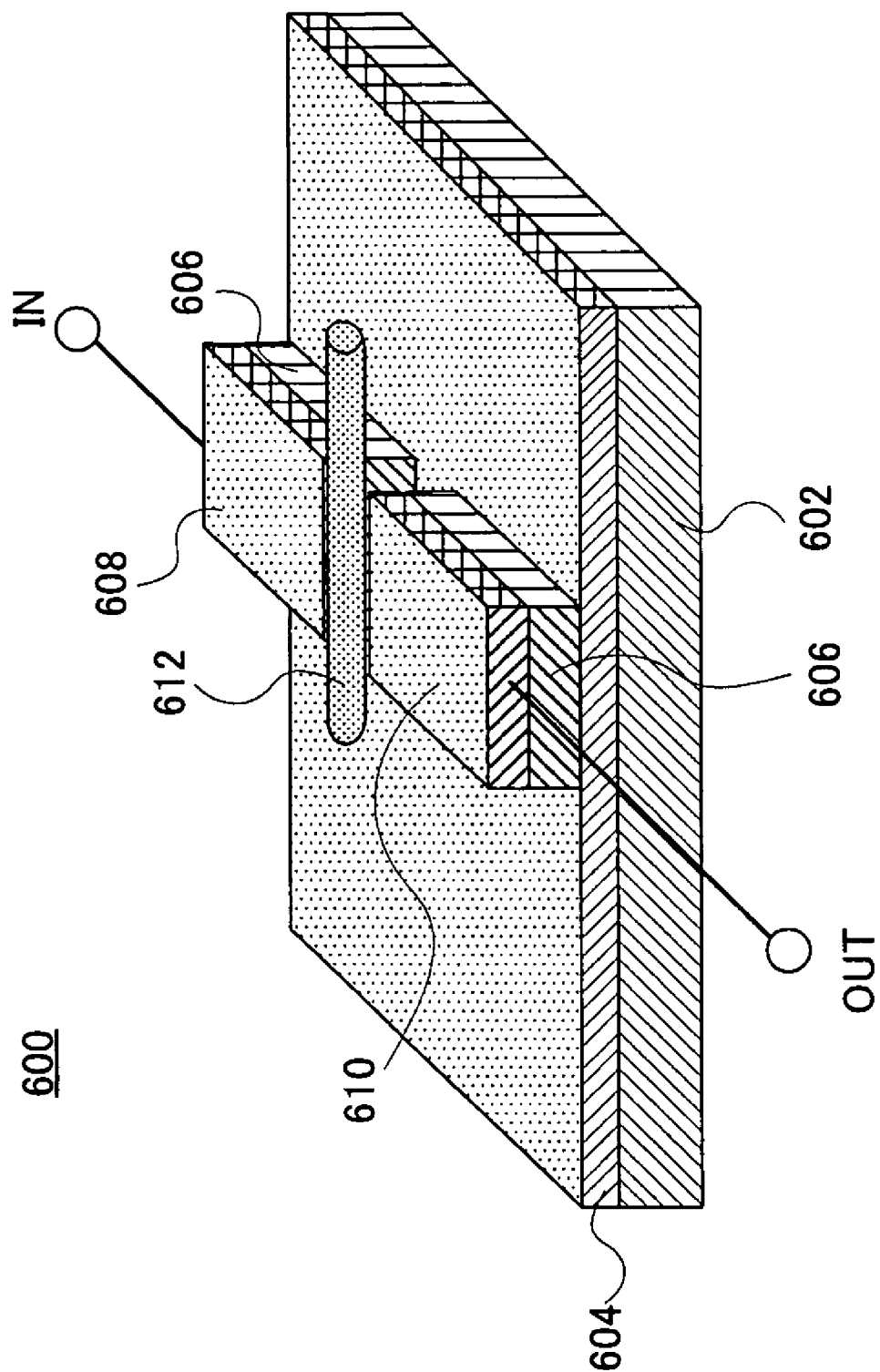
FIG. 16 is a perspective view showing a configuration for an electromechanical filter of a fourth embodiment of the present invention.

FIG. 16 is a perspective view showing a configuration for an electromechanical filter of a fourth embodiment of the present invention.

In an electromechanical filter 600 shown in FIG. 16, an insulating film 604 composed of oxidized silicon is formed on the surface of a silicon substrate 602. Electrode sections 608, 610 are arranged spaced at a predetermined gap on insulating film 604 via spacer 606 composed of oxidized silicon.

An input signal port inputting a signal is connected to electrode section 608 and an output signal port outputting a signal from electrode section 610 is connected to electrode section 610.

An oscillator 612 constituted by a carbon nanotube extending in a direction orthogonal with a facing direction of electrode sections 608, 610 is arranged between electrode sections 608, 610 in a state where a signal is propagated to electrode section 610 by oscillation of oscillator 612. This oscillator 612 is supported by a supporting member (not shown). Further, oscillator 612 has a structure symmetrical with respect to a central axis and in this case, this central axis is a horizontal axis parallel to the silicon substrate 602.

Oscillator 612 constituted by a carbon nanotube is arranged positioned distanced by a predetermined interval from electrode sections 608, 610 on either side and is excited by electrostatic force generated between oscillator 612 and electrode sections 608, 610 while a signal is inputted to electrode section 608. Further, oscillator 612 is excited while a signal having the same frequency as the resonance frequency is inputted and this is propagated to electrode section 610.

Spacer 606 is provided because of the fear of the influence of intermolecular force between oscillator 612 and insulating film 604 constituting a foundation exerting an influence on drive characteristics of oscillator 612 constituted by a carbon nanotube. Namely, because it is necessary to arrange each of the electrode sections 608, 610 facing each other so as to sandwich the carbon nanotube, spacer 606 insulates each of electrode section 608, 610, and insulating film 604.

At this electromechanical filter 600, when a signal of a predetermined frequency is inputted from the input signal port, this signal is propagated to oscillator 612 constituted by a carbon nanotube via electrode section 608. In this event, potential of oscillator 612 changes due to this signal resulting in a change in electrostatic force with electrode section 610. Oscillator 612 is excited due to this change in electrostatic force and gap between oscillator 612 and electrode section 610 becomes narrow. As a result of the gap becoming narrow, an increase in electrostatic capacitance and a decrease in impedance between oscillator 612 and electrode section 610 occurs, a signal of the same frequency as the resonance frequency of the oscillator 612 is propagated to electrode section 610, and is transmitted to the output signal port. Namely, a signal of a frequency outside of the pass band cannot be propagated to signal output side electrode section 610.

According to electromechanical filter 600, it is possible to selectively output signals of a predetermined frequency.

Figure 17:
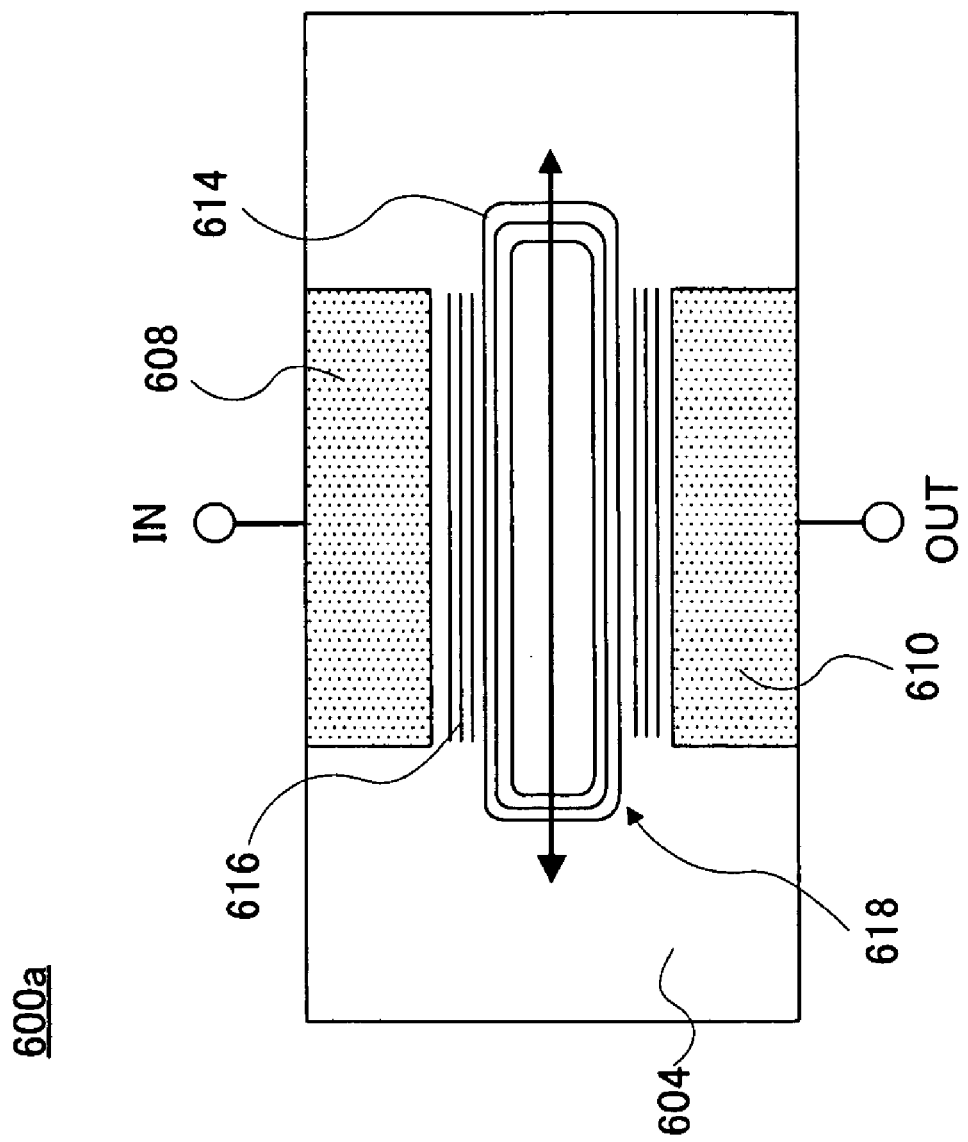
FIG. 17 is a plan cross-sectional view showing a modified example of an electromechanical filter of a fourth embodiment of the present invention.

FIG. 17 is a plain cross-sectional view showing a modified example of an electromechanical filter of a fourth embodiment.

The configuration of electromechanical filter 600a shown in FIG. 17 differs in that the configuration of the oscillator is different to that of electromechanical filter 600 corresponding to the fourth embodiment shown in FIG. 16 but other aspects of the configuration have the same configuration as the electromechanical filter 600. Description of common portions is therefore omitted, with only portions that are different being described.

The configuration of electromechanical filter 600a is a method for driving a mechanical actuator employing a carbon nanotube as an oscillator, where an inner wall 614 is taken as a multi-walled carbon nanotube and an outer wall 616 is made to oscillate by this inner wall 614. Inner wall 614 and outer wall 618 have a structure symmetrical with respect to a central axis. Here, this central axis is a horizontal axis parallel with insulating film 602 on a silicon substrate.

Multi-walled carbon nanotube 618 at electromechanical filter 600a is configured in such a manner that inner wall 614 moves in an axial direction within outer wall 616 open at an end by taking a cap at both ends or one end of one side.

Specifically, multi-walled carbon nanotube 618 is such that cylindrical inner wall 614 is arranged coaxially at a center within cylindrical outer wall 616, and both ends of inner wall 614 are given a shape projecting outwards from both ends of outer wall 616.

Further, a side peripheral section (an outer surface portion substantially horizontal to the axis of the outer wall 616 and positioned in an orthogonal direction) of outer wall 616 of multi-walled carbon nanotube 618 is connected to each electrode section 608, 610 to which the input signal port and output signal port are connected.

At electromechanical filter 600a, when a signal from the input signal port is inputted to electrode section 608, this signal is propagated to outer wall 616 from electrode section 608. Intermolecular force (van der Waals force) is then generated between atoms of the surfaces where the outer wall 616 and inner wall 614 contact each other in a state where both ends of the inner wall 614 project from the outer wall 616. The inner wall 614 is then drawn into the outer wall 616, and moves from the side of one end of outer wall 616 to the side of the other end.

In a stable state where potential energy due to intermolecular force is at a minimum, kinetic energy pulling on inner wall 614 at outer wall 616 is at a maximum. Further, in a state with the inner wall 614 stopped instantaneously on the opposite side, the potential energy due to intermolecular force again becomes a maximum, and kinetic energy becomes zero.

This movement is repeated by one end portion of outer wall 616 and the other end portion, and inner wall 614 therefore exhibits the same movement within outer wall 616 as simple oscillation of an oscillator moving along a convex potential curve at the bottom.

Namely, the inner wall 614 moves in a reciprocal manner along the axial direction of the inner wall 614 and outer wall 616 within the outer wall 616, i.e. the inner wall 614 oscillates. In order to control oscillation of inner wall 614, the carbon nanotube of the inner wall 614 is given dielectric properties using ion doping and injection of molecules etc., so that oscillation is generated by an external electric field.

Further, an external electric field is generated between electrode section 608 connected to outer wall 616 and electrode section 610. Electrostatic capacitance of inner wall 614 changes due to displacement due to movement of inner wall 614 within outer wall 616 and a signal resulting from electrical coupling is therefore propagated to the output signal port via electrode section 610.

It is also possible to adopt a way of selecting signals where a signal output side electrode section is provided at a longitudinal direction of multi-walled carbon nanotube 618 and a signal is propagated to the signal output side electrode section when a gap between a carbon nanotube of inner wall 614 constituted by an oscillator and the signal output side electrode section is narrow.

Further, an insulating film formed at the time of bonding may also be provided at a field boundary of outer wall 616, signal input side electrode section 608, and signal output side electrode section 610. In addition, because the electric field for the inner wall 614 and outer wall 616 is asymmetrical, it is also possible to carry out steps such as pulling out, sintering, and injecting different atoms into part of outer wall 616.

Further, inner wall 614 and outer wall 616 at the electromechanical filter 600a employ carbon nanotubes but this is by no means limiting and may also include carbon nanohorns, fullerenes, polymers such as proteins, semiconductors such as Si, and metals such as Al etc., or other substances forming structures by self-assembly.

Moreover, inner wall 614 and outer wall 616 may be a complex composition including substances ion-doped into a carbon nanotube and substances containing other atoms and molecules. Micromaterials such as carbon nanotubes maybe employed as material for signal input side electrode section 608 and signal output side electrode section 610.

In FIG. 16, oscillator 612 is shown as a single unit but configurations where pluralities are provided are also possible. Further, in FIG. 17, carbon nanotubtes and carbon nanohorns constituting inner wall 614 and outer wall 616 are shown as three-walled multi-walled carbon nanotubes but this is by no means limiting and other numbers of walls, multi-walled or single-walled carbon nanotubes, and multi-walled or single-walled carbon nanohorns may also be used. Further, inner wall 614 and outer wall 616 given in this embodiment are cylindrical or conical with hollow insides but this is not limiting and other shapes such as rod-shapes, coniform shapes, angular columns, or angular cones are also possible.

Further, electrode section 608 and electrode section 610 can also be made of material such as Fe (Iron), Co (Cobalt), and Ni (Nickel) that is a catalyst material for growth of carbon nanotubes. Electromechanical filters are also possible where a plurality of carbon nanotubes 618 are prepared, and each of this plurality of multi-walled carbon nanotubes 618 are connected in series so that input and output side electrode section 608, 610 are connected at both side sections. Further, electromechanical filters 600a may also be connected in parallel.

Moreover, the multi-walled structure constructed from inner wall 614 and outer wall 616 can also be formed through nanomanipulating or nanomanufacturing employing nanoprobes etc. In the case of a carbon family structure such as in this embodiment, formation is performed by covering inner wall 614 with outer wall 616, pulling out a wall of the multi-walled carbon nanotube, removing a cap of a carbon nanotube, or pulling a carbon nanotube, etc.

Further, according to the electromechanical filter 600a, it is possible to use all resonance modes including oscillation in a longitudinal direction, oscillation in a direction perpendicular to the longitudinal direction, rotational oscillation, and torsional oscillation of inner wall 614 within outer wall 616 as the oscillator. Moreover, it is also possible to connect a plurality of the multi-walled structures composed of inner wall 614 and outer wall 616 of this embodiment in series of in parallel to form an electromechanical filter so as to form a band pass filter, band stop filter, or filter bank etc. For example, with the filter bank circuit 1000 of FIG. 8, it is also possible to construct a plurality of electromechanical filters 700 of signal pass frequency bands differing according to each communication system by connecting a plurality of multi-walled structures composed of inner wall 614 and outer wall 616 in series or in parallel. Moreover, forming of spacer 606, signal input side electrode section 608, and signal output side electrode section 610 can be carried out using lift-off processing.

Fifth Embodiment

Figure 18:
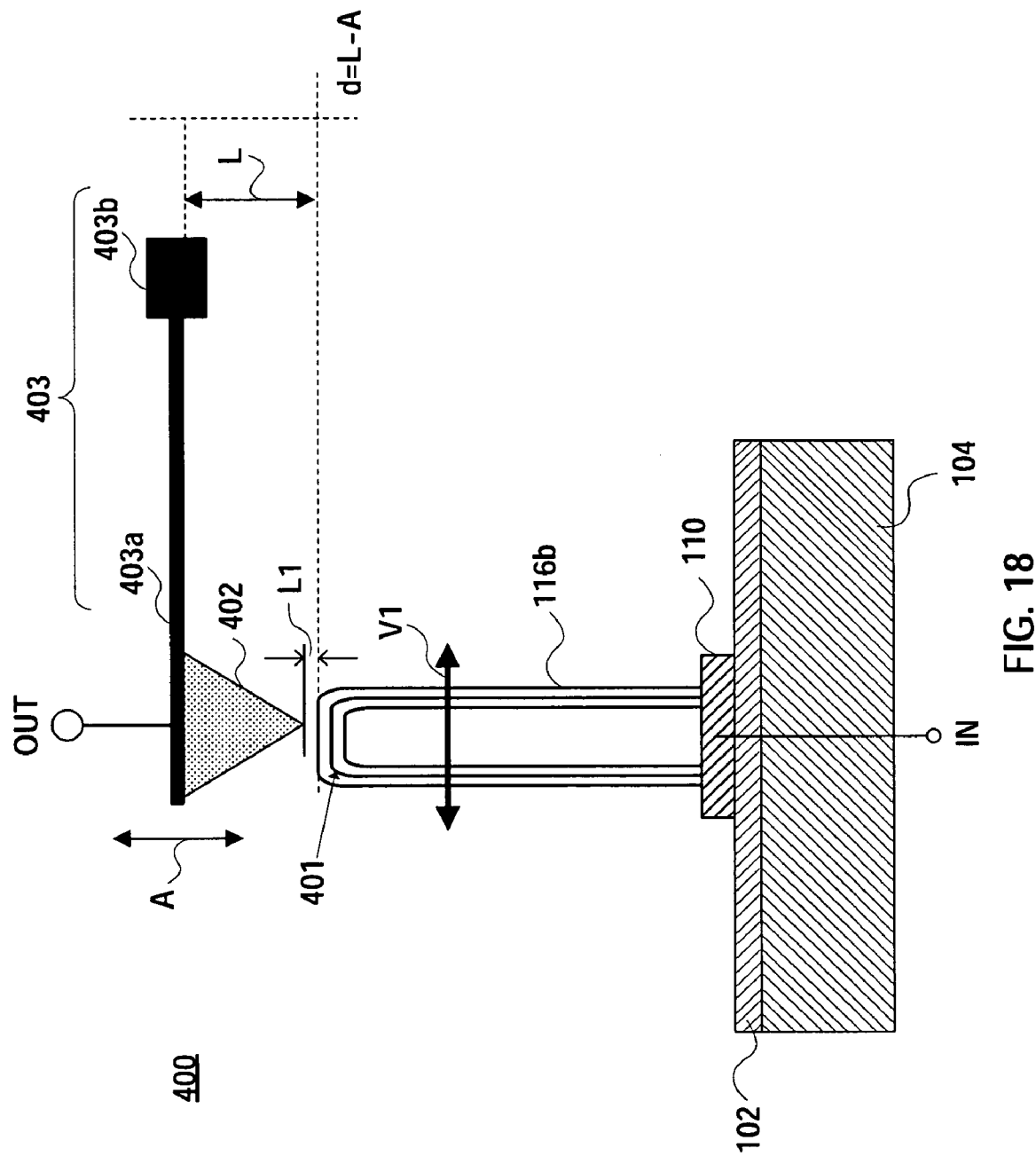
FIG. 18 is a perspective view showing a configuration for an electromechanical filter of a fifth embodiment of the present invention.

FIG. 18 is a perspective view showing a configuration for an electromechanical filter of a fifth embodiment of the present invention.

An electromechanical filter 400 shown in FIG. 18 is comprised of a resonator section 401 having the same configuration as the electromechanical filter 100b of FIG. 14, a probe tip 402 detecting oscillation of resonator section 401, and an adjustment section 403 for adjusting distance between probe tip 402 and resonator section 401.

Resonator section 401 is constructed in the same way as electromechanical filter 100 shown in FIG. 14. Signal input side electrode section 110 is provided on silicon substrate 104 with insulating film 102 formed on a surface oscillator 106b is then provided in an erect state on the upper surface of signal input electrode section 110.

Signal input side electrode section 110 inputs a signal to oscillator 106b. Further, oscillator 106b is the same as inner wall 106 taken as the oscillator shown in FIG. 14, and is comprised of self-assembled carbon nanotubes. Moreover, oscillator 106b has a structure symmetrical with respect to a central axis and in this case this central axis is a vertical axis with respect to silicon substrate 104.

On the other hand, probe tip 402 is the same as probe tip 502 shown in FIG. 14 and this probe tip 402 is moved in a direction towards and away from oscillator 106b of resonator section 401 by adjustment section 403. Movement of probe tip 402 is made to change by force acting between probe tip 402 and oscillator 106b and causes the natural frequency of oscillation of oscillator 106b to change. Further, probe tip 402 has the same effects of operation as outer wall 108 of the first embodiment.

Namely, probe tip 402 functions as an electrode detecting oscillation of resonator section 401 so that when a signal of a predetermined frequency is inputted to oscillator 106b of resonator section 401, physical change in oscillator 106b is detected and outputted to an output signal port (not shown). Although not shown, the signal output port has the same configuration and operation as the signal output port of each of the above embodiments and is therefore not described.

Adjustment section 403 is, for example, a cantilever, and is comprised of a lever body 403a provided with probe tip 402 at a front end, and a moveable body section 403b connected to a base end of lever body 403a so as to cause lever body 403a to move. Lever body 403a has flexibility and oscillates in accompaniment with oscillation of probe tip 402.

Further, moveable body section 403b moves lever body 403a in a direction of making and withdrawing contact with oscillator 106b and changes the distance between probe tip 402 and oscillator 106b. For example, moveable body section 403b is fixed to a predetermined position of an electromechanical filter. The lever body 403a itself is then made to move in a direction away from oscillator 106b as a result of lever body 403a being made to move with respect to moveable body section 403b using a stepping motor.

As shown in FIG. 18, taking distance between oscillator 106b and probe tip (probe) 402 to be L, and amplitude during oscillation of probe tip 402 to be A, distance L is made to change and amplitude A is made to change as a result of movement of lever body 403a with respect to moveable body section 403b.

Namely, distance L1 between probe tip 402 and oscillator 106b changes as a result of changing distance L.

The natural frequency of oscillation of micro oscillator 106b is changed by changing this distance L1, i.e by causing the distance L to change.

A description is now given of the natural frequency of oscillation of oscillator 106b. Natural frequency of oscillation of micro oscillator 106b is decided using the size of the oscillator itself as described above. As a result, if oscillator 106b of the desired size cannot be made, it is not possible to implement an electromechanical filter having the desired resonance frequency. Here, oscillator 106b is a cylindrical shape (specifically, a cylindrical shape with a lid provided with a cylindrical body and a cap section covering a front end of the body), and a description is given here for a cylindrical oscillator.

Figure 19:
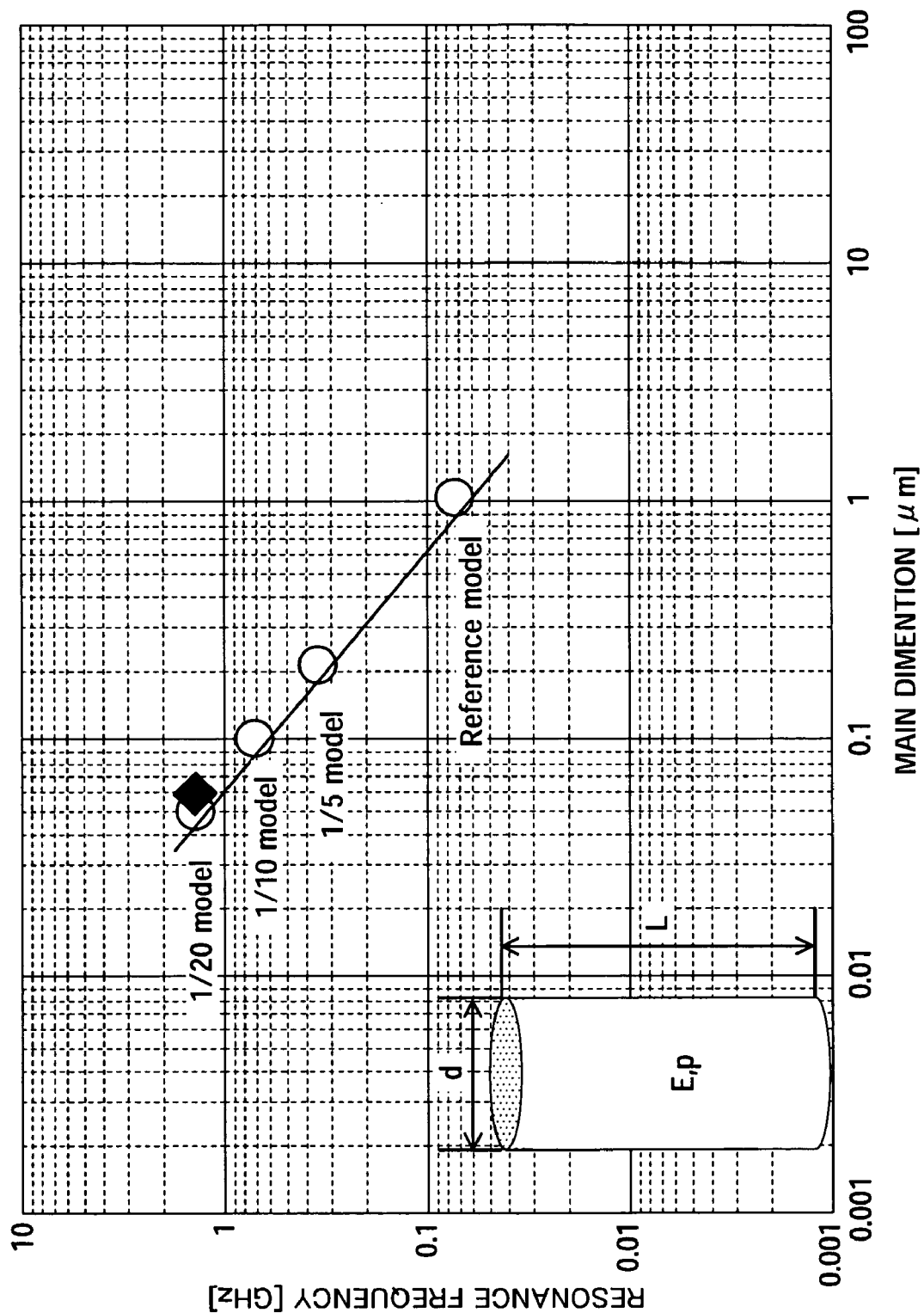
FIG. 19 is a view showing the relationship between the height of a cylindrical oscillator and its natural frequency of oscillation.

FIG. 19 is a view showing the relationship between the height of a cylindrical oscillator and its natural frequency of oscillation. As shown in FIG. 19, from (equation 1) above, resonance frequency is the length of the oscillator to the power of −2. This means that a shift in the resonance frequency will occur for a slight error in manufacturing the oscillator. When the desired resonance frequency is taken to be 1 GHz, this differs depending on the material of the oscillator but in the case of a carbon nanotube, the height of the oscillator is essentially 0.06 μm.

In the event that there is an error of 1% (0.0606 μm) in the height of the oscillator from the desired 0.06 μm, the resonance frequency changes by 2% to become 1.02 GHz, and the center frequency changes by 20 MHz. In the event that an electromechanical filter having this oscillator is employed in a wireless system as a filter during receipt and transmission of electromagnetic waves, tolerable quantity of deviation from the center frequency of the oscillator depends upon this wireless system. However, a wireless system permitting deviation in center frequency of 20 MHz is not typical and this amount of deviation is a value that cannot be ignored.

It is therefore preferable to provide a highly-precise method for manufacturing an oscillator, or a mechanism for frequency tuning oscillator 106b. As a result of the above configuration, electromechanical filter 400 of this fifth embodiment is capable of carrying out highly-precise frequency tuning.

Next, a description is given of frequency tuning carried out by electromechanical filter 400 of this embodiment.

Typically, it is well known that, with a cantilever (non-patent document "Atomic and molecular nanomechanics", Maruzen Corporation p53 to p56), if a gap d between the cantilever and a sample surface changes, the orientation and magnitude of force acting on the cantilever and sample surface changes and the resonance frequency therefore changes. The amount of change in resonance frequency, i.e. an amount of deviation from a natural frequency of oscillation of oscillator 106b is shown to be Δν.

$$\Delta \nu = \frac{1}{2\pi KA} \int_0^{2\pi} F(L + A\cos\Psi)\cos\Psi \, d\Psi \quad \text{(Equation 2)}$$

Here, ν, A and L respectively show resonance frequency of the cantilever, amplitude of oscillation, and a parallel position of the cantilever and the sample surface.

Δν is proportional to a weighted average across one cycle of force F between the cantilever and the sample. At lower amplitude limit A<<L, force F acting between probe tip 402 and oscillator 106b is proportional to Δν.

Namely, resonance frequency of oscillator 106b can be varied using the magnitude of force acting between probe tip 402 and oscillator 106b. In this way, adjustment section 403 takes on the role of correcting the amount of deviation of a resonance frequency occurring because of errors in manufacturing oscillator 106b etc.

The size of the force F is changed by the mechanism generating force between probe tip 402 and oscillator 106b. This is decided by the relative positional relationship of probe tip 402 and oscillator 106b.

If oscillator 106b and probe tip 402 are sufficiently separated, there is no interaction between oscillator 106b and probe tip 402 and force F is not generated. However, when probe tip 402 is brought close to oscillator 106b, attractive force is generated between both parties and force F is generated. Attractive force is proportional to the distance to the power of −2. Force F therefore also becomes large when the distance between probe tip 402 and oscillator 106b becomes small. Further, when probe tip 402 comes close to oscillator 106b and the distance between probe tip 402 and oscillator 106b becomes short, repulsive force is generated between oscillator 106b and probe tip 402 and the direction of force F reverses.

It is therefore possible to change the magnitude and direction of force acting on both parties by changing the distance between oscillator 106b and probe tip 402.

Figure 20:
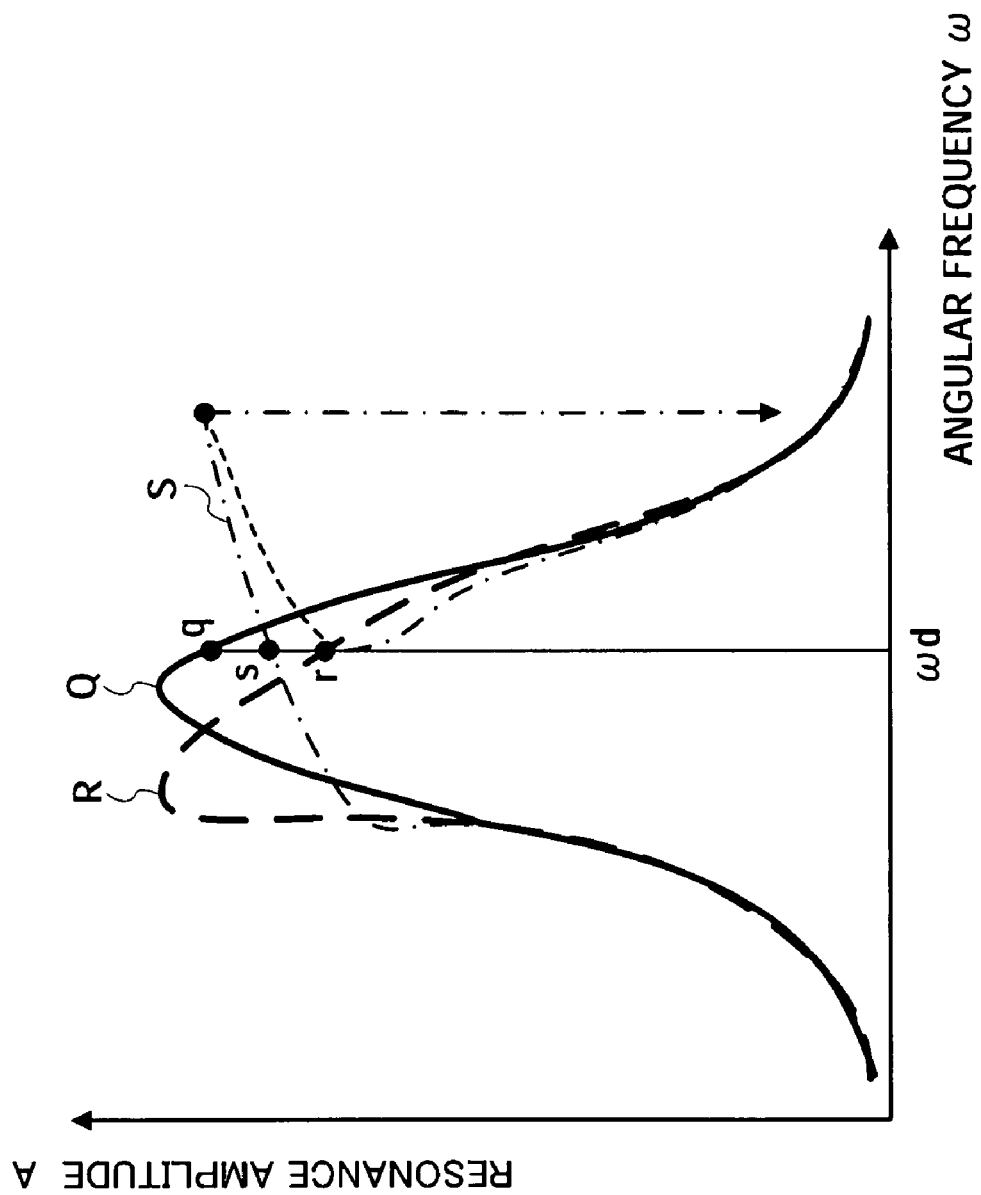
FIG. 20 is a view showing the relationship between amplitude of a probe and resonance frequency of an oscillator.

FIG. 20 is a view showing the relationship between amplitude of oscillation of probe tip 402 and resonance frequency of oscillator 106b.

FIG. 20 shows amplitude along the vertical axis and resonance frequency of oscillator 106b along the horizontal axis, with each graph Q, R, S showing characteristics for each respective region. Here, in FIG. 20, q, r and s show amplitude of oscillation for the same angular frequency ($\omega d$). However, in graph S, a region shown by a dotted line is an unstable region and an actual spectrum is shown by a solid line. Namely, at the curve S, a low-frequency side and a high-frequency side change in a discontinuous manner.

As shown in FIG. 20, in the event that the position of probe tip 402 and the position of oscillator 106b are sufficiently separated, force F as shown by graph Q in the drawings does not act and oscillator 106b therefore oscillates at its natural frequency of oscillation.

If probe tip 402 approaches oscillator 106b, force of attraction acts between probe tip 402 and oscillator 106b and the resonance frequency is shifted to the low frequency side as shown in graph R in the drawing.

Further, in the event that probe tip 402 approaches oscillator 106bb so as to enter a region of repulsive force, the orientation of force F is reversed, and the resonance frequency of oscillator 106b is shifted to the high-frequency side as shown by graph S in the drawing.

In the fifth embodiment, as in the third embodiment, the method for detecting oscillation of the probe tip 402 may also be a method of detecting change in electrostatic capacitance, detecting tunnel current, or detecting light such as with Atomic Force Microscopy (AFM).

Further, with electromechanical filter 400 of the fifth embodiment, rather than just compensating for errors in manufacturing oscillator 106b, it is also possible to compensate for changes in resonance frequency occurring due to other causes. At electromechanical filter 400, it is possible to change the center frequency of the pass band. Therefore, in the case of using a wireless terminal apparatus, channel selection and band selection is possible and application as a variable filter is also possible.

According to the electromechanical filters of each of the embodiments described above, it is possible to achieve overall miniaturization by using micro oscillators such as carbon nanotubes with superior conductivity and it is possible to select a signal of a predetermined frequency.

Further, in each of the above embodiments, it is possible to implement miniaturization of passive components in high-frequency circuits by using electromechanical filters employing carbon nanotubes as micro oscillators, thus making it possible to provide an apparatus for next generation communications towards high electrostatic capacitance high-speed communications, that increases the frequency of bands used, and provides compatibility with miniaturized terminals.

According to a first aspect of the present invention, there is adopted a configuration comprised of a first member changing physically as a result of input of a signal, and a second member, arranged at a predetermined interval from the first member, detecting physical changes of the first member when a signal of a predetermined frequency is inputted to the first member.

According to this configuration, the second member detects physical change in the first member when a signal of a predetermined frequency is inputted to the first member. Therefore, by using a microscopic member that changes physically as a result of input of a predetermined frequency such as, for example, a carbon nanotube or fullerenes, etc., it is possible to provide overall miniaturization, and it is possible to select signals of predetermined frequencies using the second member.

In a second aspect of the present invention, in the above configuration, the first member has a symmetrical structure with respect to a center axis of the first member, and oscillates as a result of input of a signal, and the second member detects oscillation of the first member when a signal of a predetermined frequency is inputted to the first member.

According to this configuration, when a signal of a predetermined frequency is inputted to the first member having a symmetrical structure with respect to a central axis of the first member, the second member detects oscillation of the first member. It is therefore possible to select signals of a predetermined frequency using just the first member. For example, by using a miniature member oscillating as a result of input of a signal of a predetermined frequency such as a carbon nanotube or fullerenes etc. as the first member, it is possible to provide overall miniaturization and it is possible to select a signal of a predetermined frequency using the second member.

In a third aspect of the present invention, a configuration is adopted where one of the first member and the second member is a wall-shaped member covering the other member.

According to this configuration, one member of the first member and second member is a wall-shaped member covering the other member. The first member and second member constitute a wall structure, and it is possible to reduce the occupied space by the portion whereby one of the first member and second member covers the other member, for example, by the portion whereby the first member is covered by the second member, and the overall scale of the electromechanical filter can be further reduced.

In a fourth aspect of the present invention, a configuration is adopted where the above configuration further comprises an input side electrode connected to the first member, causing the first member to be excited by inputting a signal to the first member, and an output side electrode connected to the second member, outputting a signal of the same frequency as the signal inputted to the first member when the second member detects oscillation of the first member.

According to this configuration, the second member detects physical change of the first member as oscillation when a signal of a predetermined frequency is inputted to the first electrode from the input side electrode, and the output side electrode outputs a signal of the same frequency as the signal inputted to the first member. It is therefore possible to selectively output the predetermined frequency.

In a fifth aspect of the present invention, a configuration is adopted where the above configuration further comprises an input side electrode arranged spaced by a predetermined interval from the first member, causing the first member to be excited as a result of input of a signal. Here, the second member is an output side electrode outputting a signal of the same frequency as the signal inputted to the first member when the second member detects oscillation of the first member.

According to this configuration, the second member detects oscillation of the first member when a signal of a predetermined frequency is inputted to the input side electrode, and the second member is taken as an output side electrode and outputs a signal of the same frequency as the inputted signal. It is therefore possible to selectively output a predetermined frequency.

According to a sixth aspect of the present invention, the second member is a wall-shaped member covering the first member, and the above configuration further comprises an input side electrode connected to the second member, causing excitation of the first member as a result of input of a signal to the second member, an electrode, connected to the first member, applying a voltage to the first member, and an output side electrode connected to the second member, outputting a signal of the same frequency as the signal inputted to the first member while the second member detects oscillation of the first member.

According to this configuration, the second member covers the first member, and when a signal of a predetermined frequency is inputted from the input side electrode to the second member, the second member detects oscillation as physical change of the first member, and the output side electrode outputs a signal of the same frequency as the signal inputted to the second member. The first member and second member are therefore not arranged in parallel and it is therefore possible to selectively output a predetermined frequency using a more microscopic structure. It is therefore possible to realize a microscopic filter that is at the cutting edge structurally.

In a seventh aspect of the present invention, a structure is adopted where, in the above configuration, at least one member of the first member and second member is composed of a substance formed through self-assembly containing carbon nanotube, carbon nanohorn, or fullerenes, and the predetermined interval is a microscopic gap formed by self-assembly by at least the first member.

According to this configuration, the first member constituting an oscillator is composed of a material formed at least by self-assembly and the predetermined interval is a microscopic gap formed by self-assembly. It is therefore not necessary to form the predetermined interval artificially, and it is straightforward to form a structure where the first member and second member are arranged spaced by the predetermined interval. For example, even if the predetermined interval is a microscopic interval that it is difficult to form artificially, this can be easily formed by self-assembly of the first member.

In an eighth aspect of the present invention, a configuration is adopted where, in the above configuration, at least the first member of the first member and the second member is composed through growth using catalyst material and is connected to an electrode section composed of electrode material containing the catalyst material.

According to this configuration, at least the first member of the first member and second member is connected to an electrode containing catalyst material. It is therefore possible to achieve growth simply by connecting the first member to the electrode section.

In a ninth aspect of the present invention, a configuration is adopted where, in the above configuration, the first member and second member are constituted by a complex composition including substances ion-doped into a carbon nanotube and substances containing other atoms and molecules.

According to this configuration, the first member and the second member are constituted by a complex composition including substances ion-doped into a carbon nanotube and substances containing other atoms and molecules. The first member and the second member therefore have dielectric properties. The first member is therefore excited so as to change physically by an electric field between the first member and the second member. The second member also resonates when a signal of a predetermined frequency is inputted to the first member. It is therefore possible to selectively output a signal of a predetermined frequency input at the first member via the second member.

In a tenth aspect of the present invention, a configuration is adopted where, in the above configuration, the first member and the second member are formed artificially using fine-processing technology.

According to this configuration, the first member and the second member are formed artificially using fine-processing technology. It is therefore possible to artificially construct an electromechanical filter capable of selectively outputting signals of a predetermined frequency using fine-processing technology.

In an eleventh aspect of the present invention, a configuration is adopted where, in the above configuration, physical change of the first member is oscillation, and detection of oscillation of the first member is carried out by detecting tunnel current flowing between the first member and the electrode using a probe connected to the electrode outputting the signal inputted to the first member.

According to this configuration, detection of oscillation of the first member is carried out by detecting tunnel current flowing between the first member and the electrode using a probe and it is therefore possible to easily detect microscopic oscillations.

In a twelfth embodiment of the present invention, a configuration is adopted where in the above configuration physical change of the first member is oscillation, and there is further provided an adjustment section causing the predetermined interval between the first member and the second member to change, and causing resonance frequency of the first member to change.

According to this configuration, the adjustment section changes the resonance frequency of the first member by changing the predetermined interval between the first member and the second member. It is therefore possible to output a signal of a predetermined frequency at the second member even if manufacturing errors occur by changing the resonance frequency of the first member using the adjustment section. Further, it is possible to vary the center frequency of a pass band of the first member and to perform channel selection and band selection using wireless receiver apparatus etc.

A thirteenth aspect of the present invention adopts a configuration including a filter bank employing electromechanical filters of the above configuration.

A fourteenth aspect of the present invention adopts a configuration having an electrical circuit of the above configuration.

According to the above configuration, an electromechanical filter of the above configuration is capable of being applied to electrical circuits containing filter banks and electrical equipment having electrical circuits. Implementation in electrical circuits such as band pass filters, band stop filters, and filter banks geared towards multi-band wireless terminals etc. and as electrical equipment miniature high-performance wireless equipment etc. is possible.

This specification is based on Japanese Patent Application No. 2003-292669, filed on Aug. 12, 2003, Japanese Patent Application No. 2004-141641 filed on May 11, 2004, and Japanese Patent Application No. 2004-229731 filed on Aug. 5, 2004, the entire content of which is expressly incorporated by reference herein.

INDUSTRIAL APPLICABILITY

The present invention is useful as an electromechanical filter equipped with a micro oscillator capable of miniaturizing overall size by employing a miniature member such as carbon nanotube or fullerenes etc. that physically changes as a result of input of a signal of a predetermined frequency as a first member.

The invention claimed is:

1. An electromechanical filter comprising:
   a first member that physically changes as a result of input of a signal; and
   a second member, spaced by a predetermined distance from the first member, that detects physical change of the first member when a signal of a predetermined frequency is input to the first member;
   wherein one of the first member and the second member is a wall-shaped member covering the other one of the first member and the second member.

2. The electromechanical filter according to claim 1, wherein:
   the first member has a symmetrical structure with respect to a center axis of the first member, and oscillates as a result of input of a signal; and
   the second member detects oscillation of the first member when a signal of the predetermined frequency is input to the first member.

3. The electromechanical filter according to claim 1, further comprising:
   an input side electrode connected to the first member and configured to cause the first member to be excited by input of a signal to the first member; and
   an output side electrode connected to the second member and outputting a signal of the same frequency as the signal input to the first member when the second member detects oscillation of the first member.

4. The electromechanical filter according to claim 1, further comprising an input side electrode spaced by a predetermined distance from the first member and causing the first member to be excited as a result of input of a signal,
   wherein the second member comprises an output side electrode that outputs a signal of the same frequency as the signal input to the first member when the second member detects oscillation of the first member.

5. The electromechanical filter according to claim 1, wherein the second member is the wall-shaped member covering the first member, the electromechanical filter further comprises:
   an input side electrode connected to the second member, causing excitation of the first member as a result of input of a signal to the second member;
   an electrode, connected to the first member and configured to apply a voltage to the first member, and
   an output side electrode connected to the second member, outputting a signal of the same frequency as the signal input to the first member, when the second member detects oscillation of the first member.

6. The electromechanical filter according to claim 1, wherein at least the first member of the first and second members is composed of a substance formed through self-assembly containing carbon nanotube, carbon nanohorn, or fullerenes, and the predetermined distance is a microscopic gap formed by self-assembly by at least the first member.

7. The electromechanical filter according to claim 1, wherein at least the first member of the first and second members is composed through growth using catalyst material and is connected to an electrode section composed of electrode material containing the catalyst material.

8. The electromechanical filter according to claim 1, wherein the first member and second member are constituted by a complex composition including substances ion-doped into a carbon nanotube and substances containing other atoms and molecules.

9. The electromechanical filter according to claim 1, wherein the first member and the second member are formed artificially using fine-processing technology.

10. An electromechanical filter comprising:
    a first member that physically changes as a result of input of a signal; and
    a second member, spaced by a predetermined distance from the first member, that detects physical change of the first member when a signal of a predetermined frequency is input to the first member,
    wherein the physical change of the first member comprises oscillation, and detection of oscillation of the first member is performed by detecting tunnel current flowing between the first member and an electrode using a probe connected to the electrode outputting the signal input to the first member.

11. The electromechanical filter according to claim 1, wherein physical change of the first member comprises oscillation, the electrochemical filter further comprising an adjustment section causing the predetermined distance between the first member and the second member to change, and causing a resonance frequency of the first member to change.

12. An electrical circuit including a filter bank employing the electromechanical filter according to claim 1.

13. Electrical equipment including the electrical circuit according to claim 12.

14. The electromechanical filter according to claim 10, wherein:
    the first member has a symmetrical structure with respect to a center axis of the first member, and oscillates as a result of input of a signal; and
    the second member detects oscillation of the first member when the signal of a predetermined frequency is input to the first member.

15. The electromechanical filter according to claim 10, further comprising:
    an input side electrode connected to the first member and configured to cause the first member to be excited by input of a signal to the first member; and an output side electrode connected to the second member and outputting a signal of the same frequency as the signal input to the first member when the second member detects oscillation of the first member.

16. The electromechanical filter according to claim 10, further comprising an input side electrode spaced by a predetermined distance from the first member and causing the first member to be excited as a result of input of a signal, wherein the second member comprises an output side electrode that outputs a signal of the same frequency as the signal input to the first member when the second member detects oscillation of the first member.

17. The electromechanical filter according to claim 10, wherein the second member is a wall-shaped member covering the first member, and the electromechanical filter further comprises:

an input side electrode connected to the second member, causing excitation of the first member as a result of input of a signal to the second member;

an electrode, connected to the first member and configured to apply a voltage to the first member, and an output side electrode connected to the second member, outputting a signal of the same frequency as the signal input to the first member, when the second member detects oscillation of the first member.

18. The electromechanical filter according to claim 10, wherein at least the first member of the first and second members is composed of a substance formed through self-assembly containing carbon nanotube, carbon nanohorn, or fullerenes, and the predetermined distance is a microscopic gap formed by self-assembly by at least the first member.

19. The electromechanical filter according to claim 10, wherein at least the first member of the first and second members is composed through growth using catalyst material and is connected to an electrode section composed of electrode material containing the catalyst material.

20. The electromechanical filter according to claim 10, wherein the first member and second members are constituted by a complex composition including substances ion-doped into a carbon nanotube and substances containing other atoms and molecules.

21. The electromechanical filter according to claim 10, wherein the first member and the second member are formed artificially using fine-processing technology.

* * * * *